United States Patent
Tsutsumi et al.

(10) Patent No.: US 10,151,977 B2
(45) Date of Patent: Dec. 11, 2018

(54) RESIN COMPOSITION, RESIN FILM, AND ELECTRONIC DEVICE

(71) Applicant: ZEON CORPORATION, Tokyo (JP)

(72) Inventors: Takashi Tsutsumi, Tokyo (JP); Yumi Osaku, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 15/549,909

(22) PCT Filed: Feb. 12, 2016

(86) PCT No.: PCT/JP2016/054177
§ 371 (c)(1),
(2) Date: Aug. 9, 2017

(87) PCT Pub. No.: WO2016/133023
PCT Pub. Date: Aug. 25, 2016

(65) Prior Publication Data
US 2018/0022912 A1    Jan. 25, 2018

(30) Foreign Application Priority Data

Feb. 19, 2015 (JP) ................................ 2015-030270

(51) Int. Cl.
| | | |
|---|---|---|
| *G03F 7/38* | (2006.01) | |
| *G03F 7/038* | (2006.01) | |
| *H01L 21/027* | (2006.01) | |
| *C08K 5/1515* | (2006.01) | |
| *C08K 5/3492* | (2006.01) | |
| *C08L 45/00* | (2006.01) | |
| *C08L 79/08* | (2006.01) | |
| *C08L 83/04* | (2006.01) | |
| *C08L 101/00* | (2006.01) | |
| *G03F 7/023* | (2006.01) | |
| *C08K 5/09* | (2006.01) | |
| *C08K 5/5435* | (2006.01) | |
| *G03F 7/022* | (2006.01) | |
| *G03F 7/075* | (2006.01) | |

(52) U.S. Cl.
CPC ................ *G03F 7/038* (2013.01); *C08K 5/09* (2013.01); *C08K 5/1515* (2013.01); *C08K 5/3492* (2013.01); *C08K 5/5435* (2013.01); *C08L 45/00* (2013.01); *C08L 79/08* (2013.01); *C08L 83/04* (2013.01); *C08L 101/00* (2013.01); *G03F 7/023* (2013.01); *G03F 7/0226* (2013.01); *G03F 7/0233* (2013.01); *G03F 7/0382* (2013.01); *G03F 7/0387* (2013.01); *G03F 7/0755* (2013.01); *G03F 7/0757* (2013.01); *H01L 21/0271* (2013.01)

(58) Field of Classification Search
CPC .......... G03F 7/038; G03F 7/039; G03F 7/004; C08L 45/00
USPC ....................................... 430/270.1
See application file for complete search history.

(56) References Cited

U.S. PATENT DOCUMENTS

2013/0224957 A1* 8/2013 Kanno ..................... G03F 7/11
438/703

FOREIGN PATENT DOCUMENTS

| JP | 2000-122299 A | 4/2000 |
|---|---|---|
| JP | 2005-292277 A | 10/2005 |
| JP | 2007-78812 A | 3/2007 |
| JP | 2013-210607 A | 10/2013 |

OTHER PUBLICATIONS

International Search Report dated Mar. 8, 2016, issued in counterpart International Application No. PCT/JP2016/054177 (2 pages).
English Translation of International Preliminary Report on Patentability (Chapter I) dated Mar. 8, 2016, issued in counterpart International Application No. PCT/JP2016/054177.

* cited by examiner

*Primary Examiner* — Amanda C. Walke
(74) *Attorney, Agent, or Firm* — Westerman, Hattori, Daniels & Adrian, LLP

(57) ABSTRACT

A resin composition comprising a binder resin (A), a compound (B) having an acidic group or latent acidic group, an organic solvent (C), and a compound (D) having one atom selected from a silicon atom, titanium atom, aluminum atom, and zirconium atom and having a hydrocarbyloxy group or hydroxy group bonded with that atom, wherein the compound (B) is at least one type selected from the group consisting of an aliphatic compound, aromatic compound, and heterocyclic compound, and a content of the compound (B) is 0.1 to 2.5 parts by weight and a content of the compound (D) is 2.2 to 7.0 parts by weight with respect to 100 parts by weight of the binder resin (A) is provided.

10 Claims, No Drawings

RESIN COMPOSITION, RESIN FILM, AND ELECTRONIC DEVICE

TECHNICAL FIELD

The present invention relates to a resin composition and a laminate comprised of a resin film obtained from this resin composition on a substrate, more particularly relates to a resin composition excellent in storage stability and able to give a resin film high in peel strength and excellent in corrosion resistance with respect to a metal and to a resin film and electronic device obtained using this resin composition.

BACKGROUND ART

Electronic devices such as display devices, integrated circuit devices, solid imaging devices, color filters, and black matrices are provided with various resin films such as protective films for preventing deterioration or damage, flattening films of boards having devices or interconnects for flattening relief due to devices or interconnects, and electrical insulating films for maintaining electrical insulation. Devices such as thin film transistor type liquid crystal display devices and integrated circuit devices are provided with resin films as interlayer insulating films for insulating among pluralities of interconnects arranged in layers. Further, as the constitution of an organic EL device and light emitting device, a constitution including an anode/hole injection-transport layer/organic light emitting layer/electron injection-layer/cathode is general. Around the light emitting parts, for electrically insulating from other devices and interconnects, pixel separation films (also called "pixel defining films" and "device separation films") are provided. Between the active devices such as transistors and the anodes, flattening films are provided. Furthermore, a display device having a touch panel structure is provided with a resin film as an interlayer insulating film for electrically insulating electrodes between pairs of such electrodes formed in a matrix state. In the past, various resin compositions have been used as materials for forming these resin films.

In the past, as the resin materials for forming these resin films, thermosetting resin materials such as epoxy resins have generally been used. However, along with the increasingly higher densities of interconnects and devices in recent years, for even these resin materials, new resin materials excellent in adhesion with substrates and excellent in electrical characteristics such as low dielectricity have been sought. To deal with these demands, for example, Patent Document 1 discloses a radiation-sensitive composition containing a binder resin comprised of a cyclic olefin-based polymer, radiation-sensitive compound, organic solvent, a compound having an acid group comprised of trimethoxysilyl benzoic acid, and a compound having a hydrocarbyloxy group bonded with a silicon atom comprised of γ-glycidoxypropyltrimethoxysilane.

RELATED ART

Patent Documents

Patent Document 1: Japanese Patent Publication No. 2005-292277A

SUMMARY OF INVENTION

Problem to be Solved by the Invention

According to the studies of the present inventors, the radiation-sensitive composition described in Patent Document 1 is in practice being used with an adhesive aid mixed in, but even so does not have sufficient peel strength with respect to a substrate. Further improvement was required.

An object of the present invention is to provide a resin composition excellent in storage stability and able to give a resin film high in peel strength and excellent in corrosion resistance with respect to a metal and provide a resin film and electronic device obtained using this resin composition.

Means for Solving the Problem

The inventors engaged in intensive research to achieve the above object and as a result discovered that it is sufficient to use a resin composition obtained by mixing, into a binder resin (A), a compound (B) having an acidic group or latent acidic group, an organic solvent (C), and a compound (D) having one atom selected from a silicon atom, titanium atom, aluminum atom, and zirconium atom and having a hydrocarbyloxy group or hydroxy group bonded with that atom, wherein the compound (B) is at least one type of compound selected from the group consisting of an aliphatic compound, aromatic compound, and heterocyclic compound and the content of the compound (B) and the content of the compound (D) are in specific ranges. Based on this discovery, the inventors completed the present invention.

That is, according to the present invention, there are provided

[1] a resin composition comprising a binder resin (A), a compound (B) having an acidic group or latent acidic group, an organic solvent (C), and a compound (D) having one atom selected from a silicon atom, titanium atom, aluminum atom, and zirconium atom and having a hydrocarbyloxy group or hydroxy group bonded with that atom, wherein the compound (B) is at least one type selected from the group consisting of an aliphatic compound, aromatic compound, and heterocyclic compound, and a content of the compound (B) is 0.1 to 2.5 parts by weight and a content of the compound (D) is 2.2 to 7.0 parts by weight with respect to 100 parts by weight of the binder resin (A),

[2] the resin composition according to [1], further comprising a radiation-sensitive compound (E),

[3] the resin composition according to [1] or [2], further comprising a cross-linking agent (F),

[4] the resin composition according to [3] comprising, as the cross-linking agent (F), an epoxy compound and a compound having a melamine structure,

[5] the resin composition according to any one of [1] to [4], wherein the binder resin (A) is at least one type of polymer selected from a cyclic olefin polymer having a protonic polar group, cardo resin, polysiloxane, and polyimide,

[6] the resin composition according to any one of [1] to [5], wherein the compound (D) is a compound further having a functional group able to react with a protonic polar group,

[7] the resin composition according to [6], wherein the functional group able to react with a protonic polar group is an isocyanate group, mercapto group, epoxy group, or amino group,

[8] the resin composition according to any one of [1] to [7], wherein the compound (D) is a compound having a hydrocarbyloxy group bonded with a silicon atom,

[9] the resin composition according to any one of [1] to [8], wherein the compound (B) is a compound having an acidic group and the compound (B) has, as the acidic group, a carboxy group, thiol group, or carboxymethylenethio group,
[10] the resin composition according to [9], wherein the compound (C) is a compound having two or more acidic groups,
[11] a resin film obtained using the resin composition according to any one of [11] to [10], and
[12] an electronic device provided with the resin film according to [11].

Effects of Invention

According to the present invention, it is possible to provide a resin composition excellent in storage stability and able to give a resin film high in peel strength and excellent in corrosion resistance with respect to a metal, a resin film obtained using such a resin composition, and an electronic device provided with such a resin film.

DESCRIPTION OF EMBODIMENTS

The resin composition of the present invention contains a binder resin (A), a compound (B) having an acidic group or latent acidic group, an organic solvent (C), and a compound (D) having one atom selected from a silicon atom, titanium atom, aluminum atom, and zirconium atom and having a hydrocarbyloxy group or hydroxy group bonded with that atom, wherein the compound (B) is at least one type selected from the group consisting of an aliphatic compound, aromatic compound, and heterocyclic compound, a content of the compound (B) is 0.1 to 2.5 parts by weight and a content of the compound (D) is 2.2 to 7.0 parts by weight with respect to 100 parts by weight of the binder resin (A).

(Binder Resin (A))

The binder resin (A) used in the present invention is not particularly limited, but a cyclic olefin polymer having a protonic polar group (A1), cardo resin (A2), polysiloxane (A3), or polyimide (A4) is preferable. Among these as well, a cyclic olefin polymer having a protonic polar group (A1) is particularly preferable. These binder resins (A) may respectively be used alone or as two types or more combined.

As the cyclic olefin polymer having a protonic polar group (A1) (below, simply referred to as the "cyclic olefin polymer (A1)"), a polymer of one or more cyclic olefin monomers or a copolymer of one or more cyclic olefin monomers and a monomer which can copolymerize with them may be mentioned, but in the present invention, as the monomer for forming the cyclic olefin polymer (A1), it is preferable to use at least a cyclic olefin monomer which has a protonic polar group (a).

Here, the "protonic polar group" means a group which contains an atom belonging to Group XV or Group XVI of the Periodic Table to which a hydrogen atom directly bonds. Among the atoms belonging to Group XV or Group XVI of the Periodic Table, atoms belonging to Period 1 or Period 2 of Group XV or Group XVI of the Periodic Table are preferable, an oxygen atom, nitrogen atom, or sulfur atom is more preferable, and an oxygen atom is particularly preferable.

As specific examples of such a protonic polar group, a hydroxyl group, carboxy group (hydroxycarbonyl group), sulfonic acid group, phosphoric acid group, and other polar groups which have oxygen atoms; primary amino group, secondary amino group, primary amide group, secondary amide group (imide group), and other polar groups which have nitrogen atoms; a thiol group and other polar groups which have sulfur atoms; etc. may be mentioned. Among these as well, ones which have oxygen atoms are preferable, carboxy group is more preferable. In the present invention, the number of protonic polar groups which bond with the cyclic olefin resin which has protonic polar groups is not particularly limited. Further, different types of protonic polar groups may also be included.

As specific examples of the cyclic olefin monomer which has a protonic polar group (a) (below, suitably called the "monomer (a)"), 2-hydroxycarbonylbicyclo[2.2.1]hept-5-ene, 2-methyl-2-hydroxycarbonylbicyclo[2.2.1]hept-5-ene, 2-carboxymethyl-2-hydroxycarbonylbicyclo[2.2.1]hept-5-ene, 2-hydroxycarbonyl-2-methoxycarbonylmethylbicyclo[2.2.1]hept-5-ene, 2-hydroxycarbonyl-2-ethoxycarbonylmethylbicyclo[2.2.1]hept-5-ene, 2-hydroxycarbonyl-2-propoxycarbonylmethylbicyclo[2.2.1]hept-5-ene, 2-hydroxycarbonyl-2-butoxycarbonylmethybicyclo[2.2.1]hept-5-ene, 2-hydroxycarbonyl-2-pentyloxycarbonylmethylbicyclo[2.2.1]hept-5-ene, 2-hydroxycarbonyl-2-hexyloxycarbonylmethylbicyclo[2.2.1]hept-5-ene, 2-hydroxycarbonyl-2-cyclohexyloxycarbonylmethylbicyclo[2.2.1]hept-5-ene, 2-hydroxycarbonyl-2-phenoxycarbonylmethylbicyclo[2.2.1]hept-5-ene, 2-hydroxycarbonyl-2-naphthyloxycarbonylmethylbicyclo[2.2.1]hept-5-ene, 2-hydroxycarbonyl-2-biphenyloxycarbonylethylbicyclo[2.2.1]hept-5-ene, 2-hydroxycarbonyl-2-benzyloxycarbonylmethylbicyclo[2.2.1]hept-5-ene, 2-hydroxycarbonyl-2-hydroxyethoxycarbonylmethylbicyclo[2.2.1]hept-5-ene, 2,3-dihydroxycarbonylbicyclo[2.2.1]hept-5-ene, 2-hydroxycarbonyl-3-methoxycarbonylbicyclo[2.2.1]hept-5-ene, 2-hydroxycarbonyl-3-ethoxycarbonylbicyclo[2.2.1]hept-5-ene, 2-hydroxycarbonyl-3-propoxycarbonylbicyclo[2.2.1]hept-5-ene, 2-hydroxycarbonyl-3-butoxycarbonylbicyclo[2.2.1]hept-5-ene, 2-hydroxycarbonyl-3-pentyloxycarbonylbicyclo[2.2.1]hept-5-ene, 2-hydroxycarbonyl-3-hexyloxycarbonylbicyclo[2.2.1]hept-5-ene, 2-hydroxycarbonyl-3-cyclohexyloxycarbonylbicyclo[2.2.1]hept-5-ene, 2-hydroxycarbonyl-3-phenoxycarbonylbicyclo[2.2.1]hept-5-ene, 2-hydroxycarbonyl-3-naphthyloxycarbonylbicyclo[2.2.1]hept-5-ene, 2-hydroxycarbonyl-3-biphenyloxycarbonylbicyclo[2.2.1]hept-5-ene, 2-hydroxycarbonyl-3-benzyloxycarbonylbicyclo[2.2.1]hept-5-ene, 2-hydroxycarbonyl-3-hydroxythxycaronylbicyclo[2.2.1]hept-5-ene, 2-hydroxycarbonyl-3-hydoxycarbonylmethylbicyclo[2.2.1]hept-5-ene, 3-methyl-2-hydoxycarbonylbicyclo[2.2.1]hept-5-ene, 3-hydroxymethyl-2-hydoxycarbonylbicyclo[2.2.1]hept-5-ene, 2-hydroxycarbonyltricyclo[5.2.1.0$^{2,6}$]deca-3,8-diene, 4-hydroxycarbonyltetracyclo[6.2.1.1$^{3,6}$.0$^{2,7}$]dodec-9-ene, 4-methyl-4-hydroxycarbonyltetracyclo[6.2.1.1$^{3,6}$.0$^{2,7}$]dodec-9-ene, 4,5-dihydroxycarbonyltetracyclo[6.2.1.1$^{3,6}$.0$^{2,7}$]dodec-9-ene, 4-carboxylmethyl-4-hydroxycarbonyltetracyclo[6.2.1.1$^{3,6}$.0$^{2,7}$]dodec-9-ene, N-(hydroxycarbonymethyl)bicyclo[2.2.1]hept-5-ene-2,3-dicarboxyimide, N-(hyroxycarbonylethyl)bicyclo[2.2.1]hept-5-ene-2,3-dicarboxyimide, N-(hydroxycarbonylpentyl)bicyclo[(2.2.1]hept-5-ene-2,3-dicarboxyimide, N-(dihydroxycarbonylethyl)bicyclo[2.2.1]hept-5-ene-2,3-dicarboxyimide, N-(dihyroxycarbonylpropyl)bicyclo[2.2.1]hept-5-ene-2,3-dicarboxyimide, N-(hydroxycarbonylphenethyl)bicyclo[2.2.1]hept-5-ene-2,3-dicarboxyimide, N-(2-(4-hydroxyphenyl)-1-(hydrocarbonyl)ethyl)bicyclo[2.2.1]hept-5-ene-2,3-dicarboxyimide, N-(hydroxycarbonylphenyl)bicyclo[(2.2.1]hept-5-ene-2,3-dicarboxyimide, and other carboxy group-containing cyclic olefins; 2-(4-hydroxyphenyl)bicyclo[2.2.1]hept-5-ene, 2-methyl-2-(4-hydroxyphenyl)bicyclo[2.2.1]hept-5-ene, 4-(4-hydroxyphenyl)tetracyclo[6.2.1.1$^{3,6}$.0$^{2,7}$]dodec-9-ene, 4-methyl-4-(4-hydroxyphenyl)tetracyclo[6.2.1.1$^{3,6}$.0$^{2,7}$]dodec-9-ene, 2-hydroxybicyclo[2.2.1]hept-5-ene, 2-hydroxymethylbicyclo[2.2.1]hept-5-ene, 2-hydroxyethylbicyclo[2.2.1]hept-5-ene, 2-methyl-2-hydroxymethylbicyclo[2.2.1]hept-5-ene, 2,3-dihydroxymethylbicyclo[2.2.1]hept-5-ene, 2-(hydroxyethoxycarbonyl)bicyclo[2.2.1]hept-5-ene, 2-methyl-2-(hydroxyethoxycarbonyl)bicyclo[2.2.1]hept-5-ene, 2-(1-hydroxy-1-trifluoromethyl-2,2,2-trifluoroethyl)bicyclo[2.2.1]hept-5-ene, 2-(2-hydroxy-2-trifluoromethyl-3,3,3-trifluoropropyl)bicyclo[2.2.1]hept-5-ene, 3-hydroxytricyclo[5.2.1.0$^{2,6}$]deca-4,8-diene, 3-hydroxymthytricyclo[5.2.1.0$^{2,6}$]deca-4,8-diene, 4-hydroxytetracyclo[6.2.1.1$^{3,6}$.0$^{2,7}$]dodec-9-ene, 4-hydroxymethyltetracyclo[6.2.1.1$^{3,6}$.0$^{2,7}$]dodec-9-ene, 4,5-dihydroxymethyltetracyclo[6.2.1.1$^{3,6}$.0$^{2,7}$]dodec-9-ene, 4-(hydroxyethoxycarbonyl)tetracyclo[6.2.1.1$^{3,6}$.0$^{2,7}$]dodec-9-ene, 4-methyl-4-(hydroxyethoxycarbonyl)tetracyclo[6.2.1.1$^{3,6}$.0$^{2,7}$]dodec-9-ene, N-(hydroxyethyl)bicyclo[2.2.1]hept-5-ene-2,3-dicarboxyimide, N-(hydroxyphenyl)bicyclo[2.2.1]hept-5-ene-2,3-dicarboxyimide, and other hydroxyl group-containing cyclic olefins etc. may be mentioned. Among these as well, from the viewpoint of the adhesion of the obtained resin film becoming higher, carboxy group-containing cyclic olefins are preferable, while 4-hydroxycarbonyltetracyclo[6.2.1.1$^{3,6}$.0$^{2,7}$]dodec-9-ene is particularly preferable. These monomers (a) may respectively be used alone or may be used as two types or more combined.

In the cyclic olefin polymer (A1), the ratio of content of the units of the monomer (a) is preferably 10 to 90 mol % with respect to all monomer units. If ratio of content of the units of the monomer (a) is too small, heat resistance is liable to become insufficient, while if too great, the cyclic olefin polymer (A1) is liable to became insufficient in solubility in a polar solvent.

Further, the cyclic olefin polymer (A1) used in the present invention may be a copolymer which is obtained by copolymerization of a cyclic olefin monomer which has a protonic polar group (a) and a monomer (b) which can copolymerize with this. As such a copolymerizable monomer (b), a cyclic olefin monomer which has a polar group other than a protonic polar group (b1), a cyclic olefin monomer which does not have a polar group (b2), and a monomer other than a cyclic olefin (b3) (below, suitably called the "monomer (b1)", "monomer (b2)", and "monomer (b3)") may be mentioned.

As the cyclic olefin monomer which has a polar group other than a protonic polar group (b1), for example, a cyclic olefin which has an N-substituted imide group, ester group, cyano group, acid anhydride group, or halogen atom may be mentioned.

As a cyclic olefin which has an N-substituted imide group, for example, a monomer represented by the following formula (1) or a monomer represented by the following formula (2) may be mentioned.

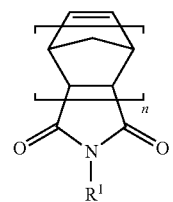

(In the above formula (1), R$^1$ indicates a hydrogen atom or alkyl group having 1 to 16 carbon atoms or aryl group. "n" indicates an integer of 1 to 2.)

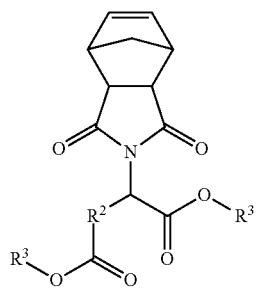

(In the above formula (2), R$^2$ indicates a bivalent alkylene group having 1 to 3 carbon atoms, while R$^3$ indicates a monovalent alkyl group having 1 to 10 carbon atoms or a monovalent halogenated alkyl group having 1 to 10 carbon atoms.)

In the above formula (1), R$^1$ is an alkyl group having 1 to 16 or aryl group. As specific examples of the alkyl group, a methyl group, ethyl group, n-propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, and other straight chain alkyl groups; cyclopropyl group, cyclobutyl group, cyclopentyl group, cyclohexyl group, cycloheptyl group, cyclooctyl group, cyclononyl group, cyclodecyl group, cycloundecyl group, cyclododecyl group, norbornyl group, bornyl group, isobornyl group, decahydronaphthyl group, tricyclodecanyl group, adamantyl group, and other cyclic alkyl groups; 2-propyl group, 2-butyl group, 2-methyl-1-propyl group, 2-methyl-2-propyl group, 1-methylbutyl group, 2-methylbutyl group, 1-methylpentyl group, 1-ethylbutyl group, 2-methylhexyl group, 2-ethylhexyl group, 4-methylheptyl group, l-ethylnonyl group, 1-methyltridecyl group, 1-methyltetradecyl group, and other branched alkyl groups; etc. may be mentioned. Further, as specific examples of the aryl group, a benzyl group etc. may be mentioned. Among these as ell, due to the more excellent heat resistance and solubility in a polar solvent, an alkyl group having 6 to 14 carbon atoms and aryl group are preferable, while an alkyl group having 6 to 10 carbon atoms and aryl group are more preferable. If the number of carbon atoms is 4 or less, the solubility in a polar solvent is inferior, while if the number of carbon atoms is 17 or more, the heat resistance is inferior. Further, when patterning the resin film, there is the problem that the resin film melts by heat and the patterns to end up disappearing.

As specific examples of the monomer represented by the above formula (1), bicyclo[2.2.1]hept-5-ene-2,3-dicarboxyimide, N-phenyl-bicyclo[2.2.1]hept-5-ene-2,3-dicarboxyimide, N-methylbicyclo[2.2.1]hept-5-ene-2,3-dicarboxyimide, N-ethylbicyclo[2.2.1]hept-5-ene-2,3-dicarboxyimide, N-propylbicyclo[2.2.1]hept-5-ene-2,3-dicarboxyimide, N-butylbicyclo[2.2.1]hept-5-ene-2,3-dicarboxyimide, N-cyclohexylbicyclo[2.2.1]hept-5-ene-2,3-dicarboxyimide, N-adamantylbicyclo[2.2.1]hept-5-ene-2,3-dicarboxyimide, N-(1-methylbutyl)-bicyclo[2.2.1]hept-5-ene-2,3-dicarboxyimide, N-(2-methylbutyl)-bicyclo[2.2.1]hept-5-ene-2,3-dicarboxyimide, N-(1-methylpentyl)-bicyclo[2.2.1]hept-5-ene-2,3-dicarboxyimide, N-(2-methylpentyl)-bicyclo[2.2.1]hept-5-ene-2,3-dicarboxyimide, N-(1-ethylbutyl)-bicyclo[2.2.1]hept-5-ene-2,3-dicarboxyimide, N-(2-ethylbutyl)-bicyclo[2.2.1]hept-5-ene-2,3-dicarboxyimide, N-(1-methylhexyl)-bicyclo[2.2.1]hept-5-ene-2,3-dicarboxyimide, N-(2-methylhexyl)-bicyclo[2.2.1]hept-5-ene-2,3-dicarboxyimide, N-(3-methylhexyl)-bicyclo[2.2.1]hept-5-ene-2,3-dicarboxyimide, N-(1-butylpentyl)-bicyclo[2.2.1]hept-5-ene-2,3-dicarboxyimide, N-(2-butylpentyl)-bicyclo[2.2.1]hept-5-ene-2,3-dicarboxyimide, N-(1-methylheptyl)-bicyclo[2.2.1]hept-5-ene-2,3-dicarboxyimide, N-(2-methylheptyl)-bicyclo[2.2.1]hept-5-ene-2,3-dicarboxyimide, N-(3-methylheptyl)-bicyclo[2.2.1]hept-5-ene-2,3-dicarboxyimide, N-(4-methylheptyl)-bicyclo[2.2.1]hept-5-ene-2,3-dicarboxyimide, N-(1-ethylhexyl)-bicyclo[2.2.1]hept-5-ene-2,3-dicarboxyimide, N-(2-ethylhexyl)-bicyclo[2.2.1]hept-5-ene-2,3-dicarboxyimide, N-(3-ethylhexyl)-bicyclo[2.2.1]hept-5-ene-2,3-dicarboxyimide, N-(1-propylpentyl)-bicyclo[2.2.1]hept-5-ene-2,3-dicarboxyimide, N-(2-propylpentyl)-bicyclo[2.2.1]hept-5-ene-2,3-dicarboxyimide, N-(1-methyloctyl)-bicyclo[2.2.1]hept-5-ene-2,3-dicarboxyimide, N-(2-methyloctyl)-bicyclo[2.2.1]hept-5-ene-2,3-dicarboxyimide, N-(3-methyloctyl)-bicyclo[2.2.1]hept-5-ene-2,3-dicarboxyimide, N-(4-methyloctyl)-bicyclo[2.2.1]hept-5-ene-2,3-dicarboxyimide, N-(1-ethylheptyl)-bicyclo[2.2.1]hept-5-ene-2,3-dicarboxyimide, N-(2-ethylheptyl)-bicyclo[2.2.1]hept-5-ene-2,3-dicarboxyimide, N-(3-ethylheptyl)-bicyclo[2.2.1]hept-5-ene-2,3-dicarboxyimide, N-(4-ethylheptyl)-bicyclo[2.2.1]hept-5-ene-2,3-dicarboxyimide, N-(1-propylhexyl)-bicyclo[2.2.1]hept-5-ene-2,3-dicarboxyimide, N-(2-propylhexyl)-bicyclo[2.2.1]hept-5-ene-2,3-dicarboxyimide, N-(3-propylhexyl)-bicyclo[2.2.1]hept-5-ene-2,3-dicarboxyimide, N-(1-methylnonyl)-bicyclo[2.2.1]hept-5-ene-2,3-dicarboxyimide, N-(2-methylnonyl)-bicyclo[2.2.1]hept-5-ene-2,3-dicarboxyimide, N-(3-methylnonyl)-bicyclo[2.2.1]hept-5-ene-2,3-dicarboxyimide, N-(4-methylnonyl)-bicyclo[2.2.1]hept-5-ene-2,3-dicarboxyimide, N-(5-methylnonyl)-bicyclo[2.2.1]hept-5-ene-2,3-dicarboxyimide, N-(1-ethyloctyl)-bicyclo[2.2.1]hept-5-ene-2,3-dicarboxyimide, N-(2-ethyloctyl)-bicyclo[2.2.1]hept-5-ene-2,3-dicarboxyimide, N-(3-ethyloctyl)-bicyclo[2.2.1]hept-5-ene-2,3-dicarboxyimide, N-(4-ethyloctyl)-bicyclo[2.2.1]hept-5-ene-2,3-dicarboxyimide, N-(1-methyldecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methylundecyl)-bicyclo[2.2.1]hept-5-ene-2,3-dicarboxyimide, N-(1-methyldodecyl)-bicyclo[2.2.1]hept-5-ene-2,3-dicarboxyimide, N-(1-methyltridecyl)-bicyclo[2.2.1]hept-5-ene-2,3-dicarboxyimide, N-(1-methyltetradecyl)-bicyclo[2.2.1]hept-5-ene-2,3-dicarboxyimide, N-(1-methylpentadecyl)-bicyclo[2.2.1]hept-5-ene-2,3-dicarboxyimide, N-phenyl-tetracyclo[6.2.1.1$^{3,6}$.0$^{2,7}$]dodec-9-ene-4,5-dicarboxyimide, N-(2,4-dimethoxyphenyl)-tetracyclo[6.2.1.1$^{3,6}$.0$^{2,7}$]dodec-9-ene-4,5-dicarboxyimide, etc. may be mentioned. Note that, these may respectively be used alone or may be used as two types or more combined.

On the other hand, in the above formula (2), $R^2$ is a bivalent alkylene group having 1 to 3 carbon atoms. As the bivalent alkylene group having 1 to 3 carbon atoms, a methylene group, ethylene group, propylene group, and isopropylene group may be mentioned. Among these as well, due to the excellent polymerization activity, a methylene group and ethylene group are preferable.

Further, in the above formula (2), $R^3$ is a monovalent alkyl group having 1 to 10 carbon atoms or monovalent halogenated alkyl group having 1 to 10 carbon atoms. As the monovalent alkyl group having 1 to 10 carbon atoms, for example, a methyl group, ethyl group, propyl group, isopropyl group, butyl group, sec-butyl group, tert-butyl group, hexyl group, cyclohexyl group, etc. may be mentioned. As the monovalent halogenated alkyl group having 1 to 10 carbon atoms, for example, a fluoromethyl group, chloromethyl group, bromomethyl group, difluoromethyl group, dichloromethyl group, difluoromethyl group, trifluoroethyl group, trichloromethyl group, 2,2,2-trifluoroethyl group, pentafluoroethyl group, heptafluoropropyl group, perfluorobutyl group, perfluoropentyl group, etc. may be mentioned. Among these as well, since the solubility in a polar solvent is excellent, as $R^3$, a methyl group or ethyl group is preferable.

Note that, the monomer represented by the above formulas (1) and (2) can, for example, be obtained by an imidization reaction between a corresponding amine and 5-norbornene-2,3-dicarboxylic acid anhydride. Further, the obtained monomer can be efficiently isolated by separating and refining the reaction solution of the imidization reaction by a known method.

As the cyclic olefin which has an ester group, for example, 2-acetoxybicyclo[2.2.1]hept-5-ene, 2-acetoxymethylbicyclo[2.2.1]hept-5-ene, 2-methoxycarbonylbicyclo[2.2.1]hept-5-ene, 2-ethoxycarbonylbicyclo[2.2.1]hept-5-ene, 2-propoxycarbonylbicyclo[2.2.1]hept-5-ene, 2-butoxycarbonylbicyclo[2.2.1]hept-5-ene, 2-cyclohexyloxycarbonylbicyclo[2.2.1]hept-5-ene, 2-methyl-2-methoxycarbonybicyclo[2.2.1]hept-5-ene, 2-methyl-2-ethoxycarbonylbicyclo[2.2.1]hept-5-ene, 2-methyl-2-propoxycarbonylbicyclo[2.2.1]hept-5-ene, 2-methyl-2-butoxycarbonylbicyclo[2.2.1]hept-5-ene, 2-methyl-2-cyclohexyloxycarbonylbicyclo[2.2.1]hept-5-ene, 2-(2,2,2-trifluoroethoxycarbonyl)bicyclo[2.2.1]hept-5-ene, 2-methyl-2-(2,2,2-trifluoroethoxycarbonyl)bicyclo[2.2.1]hept-5-ene, 2-methoxycarbonyltricyclo[5.2.1.0$^{2,6}$]dec-8-ene, 2-ethoxycarbonyltricyclo[5.2.1.0$^{2,6}$]dec-8-ene, 2-propoxycarbonyltricyclo[5.2.1.0$^{2,6}$]dec-8-ene, 4-acetoxytetracyclo[6.2.1.1$^{3,6}$.0$^{2,7}$]dodec-9-ene, 4-methoxycarbonyltetracyclo[6.2.1.1$^{3,6}$.0$^{2,7}$]dodec-9-ene, 4-ethoxycarbonyltetracyclo[6.2.1.1$^{3,6}$.0$^{2,7}$]dodec-9-ene, 4-propoxycarbonyltricyclo[6.2.1.0$^{3,6}$]dec-8-ene, 4-methyl-4-butoxycarbonyltetracyclo[6.2.1.1$^{3,6}$.0$^{2,7}$]dodec-9-ene, 4-methyl-4-methoxycarbonyltetracyclo[6.2.1.1$^{3,6}$.0$^{2,7}$]dodec-9-ene, 4-methyl-4-ethoxycarbonyltetracyclo[6.2.1.1$^{3,6}$.0$^{2,7}$]dodec-9-ene, 4-methyl-4-propoxycarbonyltetracyclo[6.2.1.1$^{3,6}$.0$^{2,7}$]dodec-9-ene, 4-methyl-4-butoxycarbonyltetracyclo[6.2.1.1$^{3,6}$.0$^{2,7}$]dodec-9-ene, 4-(2,2,2-trifluoroethoxycarbonyl)tetracyclo[6.2.1.1$^{3,6}$.0$^{2,7}$]dodec-9-ene, 4-methyl-4-(2,2,2-trifluoroethoxycarbonyl)tetracyclo[6.2.1.1$^{3,6}$.0$^{2,7}$]dodec-9-ene, etc. may be mentioned.

As the cyclic olefin which has a cyano group, for example, 4-cyanotetracyclo[6.2.1.1$^{3,6}$.0$^{2,7}$]dodec-9-ene, 4-methyl-4-cyanotetracyclo[6.2.1.1$^{3,6}$.0$^{2,7}$]dodec-9-ene, 4,5-dicyanotetracyclo[6.2.1.1$^{3,6}$.0$^{2,7}$]dodec-9-ene, 2-cyanobicyclo[2.2.1] hept-5-ene, 2-methyl-2-cyanobicyclo[2.2.1]hept-5-ene, 2,3-dicyanobicyclo[2.2.1]hept-5-ene, etc. may be mentioned.

As the cyclic olefin which has an acid anhydride group, for example, tetracyclo[6.2.1.1$^{3,6}$.0$^{2,7}$]dodec-9-ene-4,5-dicarboxylic anhydride, bicyclo[2.2.1]hept-5-ene-2,3-dicarboxylic anhydride, 2-carboxymethyl-2-hydroxycarbonylbicyclo[2.2.1]hept-5-ene anhydride, etc. may be mentioned.

As the cyclic olefin which has a halogen atom, for example, 2-chlorobicyclo[2.2.1]hept-5-ene, 2-chloromethylbicyclo[2.2.1]hept-5-ene, 2-(chlorophenyl)bicyclo[2.2.1] hept-5-ene, 4-chlorotetracyclo[6.2.1.1$^{3,6}$.0$^{2,7}$]dodec-9-ene, 4-methyl-4-chlorotetracyclo[6.2.1.1$^{3,6}$.0$^{2,7}$]dodec-9-ene, etc. may be mentioned.

These monomers (b1) may respectively be used alone or may be used as two types or more combined.

As the cyclic olefin monomer which does not have a polar group (b2), bicyclo[2.2.1]hept-2-ene (also called "norbornene"), 5-ethylbicyclo[2.2.1]hept-2-ene, 5-butyl-bicyclo [2.2.1]hept-2-ene, 5-ethylidene-bicyclo[2.2.1]hept-2-ene, 5-methylidene-bicyclo[2.2.1]hept-2-ene, 5-vinyl-bicyclo [2.2.1]hept-2-ene, tricyclo[5.2.1.0$^1$]deca-3,8-diene (common name: dicyclopentadiene), tetracyclo[10.2.1.0$^{3,11}$.0$^{4,9}$] pentadec-4,6,8,13-tetraene, tetracyclo[6.2.1.1$^{3,6}$.0$^{2,7}$]dodec-4-ene (also called "tetracyclododecene"), 9-methyl-tetracyclo[6.2.1.1$^{3,6}$.0$^{2,7}$]dodec-4-ene, 9-ethyl-tetracyclo [6.2.1.1$^{3,6}$.0$^{2,7}$]dodec-4-ene, 9-methylidene-tetracyclo [6.2.1.1$^{3,6}$.0$^{2,7}$]dodec-4-ene, 9-ethylidene-tetracyclo [6.2.1.1$^{3,6}$.0$^{2,7}$]dodec-4-ene, 9-vinyl-tetracyclo[6.2.1. 1$^{3,6}$.0$^{2,7}$]dodec-4-ene, 9-propenyl-tetracyclo[6.2.1.1$^{3,6}$.0$^{2,7}$] dodec-4-ene, pentacyclo[9.2.1.1$^{3,9}$.0$^{2,10}$.0$^{4,8}$]pentadeca-5, 12-diene, cyclobutene, cyclopentene, cyclopentadiene, cyclohexene, cycloheptene, cyclooctene, cyclooctadiene, indene, 3a,5,6,7a-tetrahydro-4,7-methano-1H-indene, 9-phenyl-tetracyclo[6.2.1.1$^{3,6}$.0$^{2,7}$]dodec-4-ene, tetracyclo [9.2.1.0$^{2,10}$.0$^{3,8}$]tetradec-3,5,7,12-tetraene, pentacyclo [9.2.1.1$^{3,9}$.0$^{2,10}$.0$^{4,8}$]pentadec-12-ene, etc. may be mentioned. These monomers (b2) may respectively be used alone or may be used as two types or more combined.

As specific examples of the monomer other than a cyclic olefin (b3), ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and other $C_2$ to $C_{20}$ α-olefins; 1,4-hexadiene, 1,5-hexadiene, 4-methyl-1,4-hexadiene, 5-methyl-1,4-hexadiene, 1,7-octadiene, and other nonconjugated dienes and their derivatives; etc. may be mentioned. Among these as well, α-olefin is preferable. These monomers (b3) may respectively be used alone or may be used as two types or more combined.

Among these monomers (b1) to (b3) as well, from the viewpoint of the effect of the present invention becoming more remarkable, a cyclic olefin monomer which has a polar group other than a protonic polar group (b1) is preferable, while a cyclic olefin which has an N-substituted imide group is particularly preferable.

In the cyclic olefin polymer (A1), the ratio of content of units of the copolymerizable monomer (b) is preferably 10 to 90 mol % with respect to the total monomer units. If the ratio of content of the units of the copolymerizable monomer (b) is too small, the cyclic olefin polymer (A1) is liable to become insufficient in solubility in a polar solvent, while if too great, heat resistance is liable to become insufficient.

Note that, in the present invention, it is also possible to introduce a protonic group in a cyclic olefin-based polymer which does not have a protonic polar group utilizing a known modifying agent so as to obtain the cyclic olefin polymer (A1). The polymer which does not have a protonic polar group can be obtained by polymerizing at least one of the above-mentioned monomers (b1) and (b2) and, in accordance with need, a monomer (b3) in any combination.

Further, the cyclic olefin polymer (A1) used in the present invention may be a ring-opened polymer obtained by ring-opening polymerization of the above-mentioned monomers or may be an addition polymer obtained by addition polymerization of the above-mentioned monomers, but from the viewpoint of the effect of the present invention becoming more remarkable, a ring-opened polymer is preferable.

A ring-opened polymer can be produced by ring-opening metathesis polymerization of a cyclic olefin monomer which has a protonic polar group (a) and a copolymerizable monomer (b) used according to need in the presence of a metathesis reaction catalyst. As the method of production, for example, the method described in International Publication No. 2010/110323A, [0039] to [0079], etc. can be used. On the other hand, an addition polymer can be obtained by causing polymerization of a cyclic olefin monomer which has a protonic polar group (a) and a copolymerizable monomer (b) used according to need using a known additional polymerization catalyst, for example, a catalyst comprised of a compound of titanium, zirconium, or vanadium and an organic aluminum compound.

Further, when the cyclic olefin polymer (A1) used in the present invention is a ring-opened polymer, it is preferable to further perform a hydrogenation reaction and obtain a hydrogenated product in which the carbon-carbon double bonds which are contained in the main chain are hydrogenated. When the cyclic olefin polymer (A1) is a hydrogenated product, the ratio of the hydrogenated carbon-carbon double bonds (hydrogenation rate) is usually 50% or more. From the viewpoint of the heat resistance, 70% or more is preferable, 90% or more is more preferable, and 95% or more is furthermore preferable.

The cardo resin (A2) used in the present invention is a resin which has a cardo structure, that is, a skeletal structure with two cyclic structures bonded to a quaternary carbon atom which forms a cyclic structure. A general form of a Cardo structure is a structure in which benzene rings bond to a fluorene ring.

As specific examples of a skeletal structure where two cyclic structures are bonded to a quaternary carbon atom forming a cyclic structure, a fluorene skeleton, bisphenol fluorene skeleton, bisaminophenyl fluorene skeleton, fluorine skeleton having an epoxy group, fluorene skeleton having an acryl group, etc. may be mentioned.

The cardo resin (A2) used in the present invention is formed by polymerization by reacting functional groups which bond to skeletons having cardo structure each other. The cardo resin (A2) has a structure where the main chain and bulky side chains are connected by a single element (cardo structure) and has a cyclic structure in the direction substantially vertical to the main chain.

As one example of the cardo structure, an example of a cardo structure having an epoxyglycidyl ether structure is shown in the following formula (3).

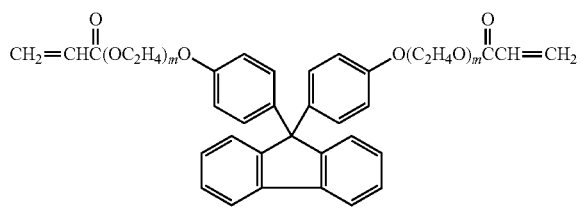

(3)

(In the above formula (3), "m" is an integer of 0 to 10.)

The monomer which has a cardo structure is, for example, a bis(glycidyloxyphenyl) fluorene-type epoxy resin; a condensate of a bisphenolfluorene-type epoxy resin and acrylic acid; 9,9-bis(4-hydroxyphenyl) fluorene, 9,9-bis(4-hydroxy-3-methylphenyl) fluorene, or other cardo structure-containing bisphenols; 9,9-bis(cyanomethyl) fluorene or other 9,9-bis(cyanoalkyl) fluorenes; 9,9-bis(3-aminopropyl) fluorene or other 9,9-bis(aminoalkyl) fluorenes; etc. may be mentioned.

The cardo resin (A2) is a polymer which is obtained by polymerization of a monomer which has a cardo structure, but may also be a copolymer with another copolymerizable monomer.

The polymerization method of the above monomers may be an ordinary method. For example, the ring-opening polymerization method or addition polymerization method etc. may be employed.

The polysiloxane (A3) used in the present invention is not particularly limited, but preferably a polymer which is obtained by mixing and reacting one or more types of organosilane represented by the following formula (4) may be mentioned.

$$(R^4)_p\text{—Si—}(OR^5)_{4-p} \quad (4)$$

In the above formula (4), $R^4$ is a hydrogen atom, alkyl group having 1 to 10 carbon atoms, alkenyl group having 2 to 10 carbon atoms, or aryl group having 6 to 15 carbon atoms. The plurality of $R^4$ may be the same or different. Note that, these alkyl groups, alkenyl groups, and aryl groups may all have substituents. Further, they may be nonsubstituted groups which do not have substituents and may be selected in accordance with the properties of the composition. As specific examples of the alkyl group, a methyl group, ethyl group, n-propyl group, isopropyl group, n-butyl group, t-butyl group, n-hexyl group, n-decyl group, trifluoromethyl group, 2,2,2-trifluoroethyl group, 3,3,3-trifluoropropyl group, 3-glycidoxypropyl group, 2-(3,4-epoxy cyclohexyl) ethyl group, 3-aminopropyl group, 3-mercaptopropyl group, and 3-isocyanatepropyl group may be mentioned. As specific examples of the alkenyl group, a vinyl group, 3-acryloxypropyl group, and 3-methacryloxypropyl group may be mentioned. As specific example of the aryl group, a phenyl group, tolyl group, p-hydroxyphenyl group, 1-(p-hydroxyphenyl)ethyl group, 2-(p-hydroxyphenyl)ethyl group, 4-hydroxy-5-(p-hydroxyphenylcarbonyloxy)pentyl group, and naphthyl group may be mentioned.

Further, in the above formula (4), $R^5$ is a hydrogen atom, alkyl group having 1 to 6 carbon atoms, acyl group having 1 to 6 carbon atoms, or aryl group having 6 to 15 carbon atoms, where the plurality of $R^5$ may be the same or different. Note that, these alkyl groups and acyl groups may all have substituents. Further, they may be nonsubstituted groups which do not have substituents and may be selected in accordance with the properties of the composition. As specific examples of the alkyl group, a methyl group, ethyl group, n-propyl group, isopropyl group, and n-butyl group may be mentioned. As a specific example of the acyl group, an acetyl group may be mentioned. As a specific example of an aryl group, a phenyl group may be mentioned.

Furthermore, in the above formula (4), "p" is an integer of 0 to 3. Wen p=0, the compound becomes tetrafunctional silane, when p=1, it becomes trifunctional silane, when p=2, it becomes bifunctional silane, and when p=3, it becomes monofunctional silane.

As specific examples of an organosilane represented by the above formula (4), tetramethoxysilane, tetraethoxysilane, tetraacetoxysilane, tetraphenoxysilane, or other tetrafunctional silanes; methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltrimethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy) pentyltrimethoxysilane, trifluoromethyltrimethoxysilane, trifluoromethyltrimethoxysilane, 3,3,3-trifluoropropyltrimethoxysilane, 3-aminopropyltrimethoxysilane, 3-aminopropyltriethoxysilane, 3-glycidoxypropyltrimethoxysilane, 2-(3,4-epoxy cyclohexyl)ethyltrimethoxysilane, 3-mercaptopropyltrimethoxysilane, or other trifunctional silanes; dimethyldimethoxysilane, dimethyldiethoxysilane, dimethyldiacetoxysilane, di-n-butyldimethoxysilane, diphenyldimethoxysilane, or other bifunctional silanes; trimethylmethoxysilane, tri-n-butylethoxysilane, or other monofunctional silanes; may be mentioned.

Among these organosilanes, from the viewpoint of the crack resistance or hardness of the obtained resin film, trifunctional silanes are preferably used. These organosilanes may be used alone or may be used as two types or more combined.

The polysiloxane (A3) used in the present invention is obtained by the hydrolysis or partial condensation of the above-mentioned organosilanes. For the hydrolysis and partial condensation, general methods can be used. For example, a solvent, water, and according to need a catalyst are added to the mixture and heated and stirred. During stirring, in accordance with need, distillation may be used to distill off the hydrolysis byproducts (methanol or other alcohol) or condensation byproduct (water).

The polyimide (A4) used in the present invention can be obtained by heat treating a polyimide precursor obtained by reacting a tetracarboxylic anhydride and diamine. As the precursor for obtaining the polyimide, a polyamic acid, polyamic acid ester, polyisoimide, polyamic acid sulfonamide, etc. may be mentioned.

The polyimide (A4) used in the present invention is synthesized by a known method. That is, it is synthesized by a known method such as selectively combining tetracarboxylic dianhydride and a diamine and reacting these in N-methyl-2-pyrrolidone, N, N-dimethylacetoamide, N,N-dimethylformamide, dimethylsulfoxide, hexamethylphosphoric triamide, γ-butyrolactone, cyclopentanone, or other polar solvent.

When excessively using a diamine for polymerization, it is possible to make a carboxylic anhydride react with the end amino group of the produced polyimide (A4) so as to protect the end amino group. Further, when excessively using tetracarboxylic anhydride for polymerization, it is possible to make an amine compound react with the end acid anhydride group of the produced polyimide (A4) so as to protect the end acid anhydride group.

As examples of such carboxylic anhydrides, phthalic anhydride, trimellitic anhydride, maleic anhydride, naphthalic anhydride, hydrogenated phthalic anhydride, methyl-5-norbornene-2,3-dicarboxylic anhydride, itaconic anhydride, tetrahydrophthalic acid anhydride, etc. may be mentioned, while as examples of amine compounds, aniline, 2-hydroxyaniline, 3-hydroxyaniline, 4-hydroxyaniline, 2-ethynylaniline, 3-ethynylaniline, 4-ethynylaniline, etc. may be mentioned.

The binder resin (A) used in the present invention has a weight average molecular weight (MW) of usually 1,000 to 1,000,000, preferably 1,500 to 100,000, more preferably 2,000 to 10,000 in range.

Further, the binder resin (A) has a molecular weight distribution of a weight average molecular weight/number average molecular weight (Mw/M) ratio of usually 4 or less, preferably 3 or less, more preferably 2.5 or less.

The weight average molecular weight (MW) and molecular weight distribution/Mn) of the binder resin (A) are values which are found by gel permeation chromatography (GPC) using tetrahydrofuran and other solvents as eluents and as values converted to polystyrene.

(Compound (B) Having Acidic Group or Latent Acidic Group)

The compound (B) having an acidic group or latent acidic group used in the present invention may be any compound which has an acidic group or a latent acidic group forming an acid by heat or light. In the present invention, at least one type selected from a group consisting of an aliphatic compound, aromatic compound, and heterocyclic compound is used. Among these as well, an aromatic compound and a heterocyclic compound are preferable.

The number of acidic groups is not particularly limited, but one having a total of two or more acidic groups is preferable. The acidic groups may be the same as each other or may be different.

The acidic group may be a group having acidity. As specific examples, a strong acidic group such as sulfonic acid group and phosphoric acid group; weak acid group such as carboxyl group, thiol group, and carboxymethylenethio group; may be mentioned. Among these as well, carboxyl group, thiol group, or carboxymethylenethio group are preferable, while carboxyl group is particularly preferable. Further, among these acidic groups as well, one having an acid dissociation constant pKa of 3.5 or more and 5.0 or less in range is preferable. Note that if there are two or more acidic groups, the first dissociation constant pKa1 is to be made the acid dissociation constant and one where the first dissociation constant pKa1 is within the above range is preferable. Further, pKa is found by measuring an acid dissociation constant $Ka=[H_3O^+][B^-]/[BH]$ under a dilute aqueous solution condition in accordance with $pKa=-\log Ka$. Here, "BH" indicates an organic acid, while "B$^-$" indicates a conjugate base of the organic acid.

Note that, in the method of measurement of the pKa, for example, the hydrogen ion concentration is measured using a pH meter and the pKa is calculated from the concentration of that substance and the concentration of hydrogen ions.

Furthermore, the compound (B) having an acidic group or latent acidic group may also have a substituent other than an acidic group and latent acidic group.

As such a substituent, in addition to a hydrocarbon group such as alkyl group and aryl group, a halogen atom; an alkoxy group, aryloxy group, acyloxy group, heterocyclic oxy group; an amino group, acylamino group, ureido group, sulfamoylamino group, alkoxycarbonylamino group, and aryloxycarbonylamino group which are substituted by an alkyl group, aryl group, or heterocyclic group; an alkylthio group, arylthio group, and heterocyclic thio group; and other polar groups not having protons, hydrocarbon groups substituted by these polar groups not having protons, etc. may be mentioned.

As specific examples of the compound having an acidic group in such a compound (B) having an acidic group or latent acidic group, an aliphatic compound such as methanoic acid, ethanoic acid, propanoic acid, butanoic acid, pentanoic acid, hexanoic acid, heptanoic acid, octanoic acid, nonanoic acid, decanoic acid, glycolic acid, glyceric acid, ethanedioic acid (also referred to as "oxalic acid"), propanedioic acid (also referred to as "malonic acid"), butanedioic acid (also referred to as "succinic acid"), pentanedioic acid, hexanedioic acid (also referred to as "adipic acid"), 1,2-cyclohoxanedicarboxylic acid, 2-oxopropanoic acid, 2-hydroxybutanedioic acid, 2-hydroxypropanetricarboxylic acid, mercaptosuccinic acid, dimercaptosuccinic acid, 2,3-dimercapto-1-propanol, 1,2,3-trimercaptopropane, 2,3,4-trimercapto-1-butanol, 2,4-dimercapto-1,3-butanediol, 1,3,4-trimercapto-2-butanol, 3,4-dimercapto-1,2-butanediol, and 1,5-dimercapto-3-thiapentane;

an aromatic compound such as benzoic acid, p-hydroxybenzene carboxylic acid, o-hydroxybenzene carboxylic acid, 2-naphthalene carboxylic acid, methyl benzoic acid, dimethyl benzoic acid, trimethyl benzoic acid, 3-phenyl propanoic acid, dihydroxybenzoic acid, dimethoxybenzoic acid, benzene-1,2-dicarboxylic acid (also referred to as "phthalic acid"), benzene-1,3-dicarboxylic acid (also referred to as "isophthalic acid"), benzene-1,4-dicarboxylic acid (also referred to as "terephthalic acid"), benzene-1,2,3-tricarboxylic acid, benzene-1,2,4-tricarboxylic acid, benzene-1,3,5-tricarboxylic acid, benzene hexacarboxylic acid, biphenyl-2,2'-dicarboxylic acid, 2-(carboxymethyl)benzoic acid, 3-(carboxymethyl)benzoic acid, 4-(carboxymethyl) benzoic acid, 2-(carboxycarbonyl)benzoic acid, 3-(carboxycarbonyl)benzoic acid, 4-(carboxycarbonyl)benzoic acid, 2-mercaptobenzoic acid, 4-mercaptobenzoic acid, diphenolic acid, 2-mercapto-6-naphthalene carboxylic acid, 2-mercapto-7-naphthalene carboxylic acid, 1,2-dimercaptobenzene, 1,3-dimercaptobenzene, 1,4-dimercaptobenzene, 1,4-naphthalenedithiol, 1,5-naphthalenedithiol, 2,6-naphthalenedithiol, 2,7-naphthalenedithiol, 1,2,3-trimercaptobenzene, 1,2,4-trimercaptabenzene, 1,3,5-trimercaptobenzene, 1,2,3-tris(mercaptomethyl)benzene, 1,2,4-tris(mercaptoethyl)benzene, 1,3,5-tris(mercaptomethyl)benzene, 1,2,3-tris(mercaptoethyl)benzene, 1,2,4-tris (mercaptoethyl)benzene, and 1,3,5-tris(mercaptoethyl)benzene;

a five-member heterocyclic compound containing a nitrogen atom such as nicotinic acid, isonicotinic acid, 2-furoic acid, pyrrole-2,3-dicarboxylic acid, pyrrole-2,4-dicarboxylic acid, pyrrole-2,5-dicarboxylic acid, pyrrole-3,4-dicarboxylic acid, imidazole-2,4-dicarboxylic acid, imidazole-2,5-dicarboxylic acid, imidazole-4,5-dicarboxylic acid, pyrazole-3,4-dicarboxylic acid, and pyrazole-3,5-dicarboxylic acid; a five-membered heterocyclic compound containing a nitrogen atom and a sulfur atom such as thiophene-2, 3-dicarboxylic acid, thiophene-2,4-dicarboxylic acid, thiophene-2,5-dicarboxylic acid, thiophene-3,4-dicarboxylic acid, thiazole-2,4-dicarboxylic acid, thiazole-2,5-dicarboxylic acid, thiazole-4,5-dicarboxylic acid, isothiazole-3,4-dicarboxylic acid, isothiazole-3,5-dicarboxylic acid, 1,2,4-thiadiazole-2,5-dicarboxylic acid, 1,3,4-thiadiazole-2,5-dicarboxylic acid, 3-amino-5-mercapto-1,2,4-thiadiazole, 2-amino-5-mercapto-1,3,4-thiadiazole, 3,5-dimercapto-1,2,4-thiadiazole, 2,5-dimercapto-1,3,4-thiadiazole, 3-(5-mercapto-1,2,4-thiadiazol-3-ylsulfanyl) succinic acid, 2-(5-mercapto-1,3,4-thiadiazol-2-ylthio) succinic acid, (5-mercapto-1,2,4-thiadiazol-3-ylthio) acetic acid, (5-mercapto-1,3,4-thiadiazol-2-ylthio) acetic acid, 3-(5-mercapto-1,2,4-thiadiazol-3-ylthio) propionic acid, 2-(5-mercapto-1,3,4-thiadiazol-2-ylthio) propionic acid, 3-(5-mercapto-1,2,4-thiadiazol-3-ylthio) succinic acid, 2-(5-mercapto-1,3,4-thiadiazol-2-ylthio) succinic acid, 4-(3-mercapto-1,2,4-thiadiazol-5-yl)thiobutane sulfonic acid, and 4-(2-mercapto-1,3,4-thiadiazol-5-yl)thiobutane sulfonic acid;

a six-member heterocyclic compound containing a nitrogen atom such as pyridine-2,3-dicarboxylic acid, pyridine-2,4-dicarboxylic acid, pyridine-2,5-dicarboxylic acid, pyridine-2,6-dicarboxylic acid, pyridine-3,4-dicarboxylic acid, pyridine-3,5-dicarboxylic acid, pyridazine-3,4-dicarboxylic acid, pyridazine-3,5-dicarboxylic acid, pyridazine-3,6-dicarboxylic acid, pyridazine-4,5-dicarboxylic acid, pyrimidine-2,4-dicarboxylic acid, pyrimidine-2,5-dicarboxylic acid, pyrimidine-4,5-dicarboxylic acid, pyrimidine-4,6-dicarboxylic acid, pyrazine-2,3-dicarboxylic acid, pyrazine-2,5-dicarboxylic acid, pyridine-2,6-dicarboxylic acid, triazine-2,4-dicarboxylic acid, 2-diethylamino-4,6-dimercapto-s-triazine, 2-dipropylamino-4,6-dimercapto-s-triazine, 2-dibutylamino-4,6-dimercapto-s-triazine, 2-anilino-4,6-dimercapto-s-triazine, and 2,4,6-trimercapto-s-triazine; etc. may be mentioned.

Among these as well, from the viewpoint of enabling the resin film formed using the resin composition to be made better in peel strength, the number of acidic groups is preferably 2 or more, particularly preferably is 2.

As a compound having two acidic groups, ethanedioic acid, propanedioic acid, butanedioic acid, pentanedioic acid, hexanedioic acid, 1,2-cyclohexanedicarboxylic acid; an aromatic compound having two acidic groups such as benzene-1,2-dicarboxylic acid (also referred to as "phthalic acid"), benzene-1,3-dicarboxylic acid (also referred to as "isophthalic acid"), benzene-1,4-dicarboxylic acid (also referred to as "terephthalic acid"), biphenyl-2,2'-dicarboxylic acid, 2-(carboxymethyl)benzoic acid, 3-(carboxymethyl)benzoic acid, 4-(carboxymethyl)benzoic acid, 2-mercaptobenzoic acid, 4-mercaptobenzoic acid, 2-mercapto-6-naphthalenecarboxylic acid, 2-mercapto-7-naphthalenecarboxylic acid, 1,2-dimercaptobenzene, 1,3-dimercaptobenzene, 1,4-dimercaptobenzene, 1,4-naphthalenedithiol, 1,5-naphthalenedithiol, 2,6-naphthalenedithiol, and 2,7-naphthalenedithiol; a heterocyclic compound having two acidic groups such as pyrrole-2,3-dicarboxylic acid, pyrrole-2,4-dicarboxylic acid, pyrrole-2,5-dicarboxylic acid, pyrrole-3,4-dicarboxylic acid, imidazole-2,4-dicarboxylic acid, imidazole-2,5-dicarboxylic acid, imidazole-4,5-dicarboxylic acid, pyrazole-3,4-dicarboxylic acid, pyrazole-3,5-dicarboxylic acid, thiophene-2,3-dicarboxylic acid, thiophene-2,4-dicarboxylic acid, thiophene-2,5-dicarboxylic acid, thiophene-3,4-dicarboxylic acid, thiazole-2,4-dicarboxylic acid, thiazole-2,5-dicarboxylic acid, thiazole-4,5-dicarboxylic acid, isothiazole-3,4-dicarboxylic acid, isothiazole-3,5-dicarboxylic acid, 1,2,4-thiadiazole-2,5-dicarboxylic acid, 1,3,4-thiadiazole-2,5-dicarboxylic acid, (5-mercapto-1,2,4-thiadiazol-3-ylthio) acetic acid, (5-mercapto-1,3,4-thiadiazol-2-ylthio) acetic acid, pyridine-2,3-dicarboxylic acid, pyridine-2,4-dicarboxylic acid, pyridine-2,5-dicarboxylic acid, pyridine-2,6-dicarboxylic acid, pyridine-3,4-dicarboxylic acid, pyridine-3,5-dicarboxylic acid, pyridazine-3,4-dicarboxylic acid, pyridazine-3,5-dicarboxylic acid, pyridazine-3,6-dicarboxylic acid, pyridazine-4,5-dicarboxylic acid, pyrimidine-2,4-dicarboxylic acid, pyrimidine-2,5-dicarboxylic acid, pyrimidine-4,5-dicarboxylic acid, pyrimidine-4,6-dicarboxylic acid, pyrazine-2,3-dicarboxylic acid, pyrazine-2,5-dicarboxylic acid, pyridine-2,6-dicarboxylic acid, and triazine-2,4-dicarboxylic acid; are preferable.

Further, a latent acidic group may be a group which produces an acidic functional group by light or heating. As specific examples, a sulfonium salt group, benzothiazolium salt group, ammonium salt group, phosphonium salt group, iodonium salt group, block carboxylic salt group, etc. may be mentioned. Among these as well, a sulfonium salt group is preferable. For example, a phosphorus hexafluoride-based or antimony hexafluoride-based sulfonium salt group may be used. As a compound having such a sulfonium salt group, for example, the San-aid SI Series (100L, 110L, 150, and 180L, made by Sanshin Chemical Industry) etc. may be used.

In the resin composition of the present invention, the content of the compound (B) having an acidic group or latent acidic group is 0.1 to 2.5 parts by weight with respect to 100 parts by weight of the binder resin (A), preferably 0.2 to 2.3 parts by weight, more preferably 0.3 to 2.0 parts by weight, still more preferably 0.5 to 1.5 parts by weight. If the content of the compound (B) having an acidic group or latent acidic group is too small, the obtained resin film ends up becoming inferior in peel strength. On the other hand, if too large, the obtained resin film ends up becoming inferior in corrosion resistance with respect to a metal.

(Organic Solvent (C))

The organic solvent (C) used in the present invention is not particularly limited. As specific examples, an alkylene glycol such as ethylene glycol, propylene glycol, diethylene glycol, triethylene glycol, and tetraethylene glycol; an alkylene glycol monoether such as ethylene glycol monoethyl ether, ethylene glycol monopropyl ether, ethylene glycol mono-t-butyl ether, propylene glycol monoethyl ether, propylene glycol monopropyl ether, propylene glycol monobutyl ether, diethylene glycol monomethyl ether, diethylene glycol monoethyl ether, dipropylene glycol monomethyl ether, dipropylene glycol monomethyl ether, dipropylene glycol monoethyl ether, triethylene glycol monomethyl ether, triethylene glycol monoethyl ether, tripropylene glycol monomethyl ether, and tripropylene glycol monoethyl ether; an alkylene glycol dialkyl ether such as diethylene glycol dimethyl ether, diethylene glycol diethyl ether, diethylene glycol ethylmethyl ether, dipropylene glycol dimethyl ether, dipropylene glycol diethyl ether, dipropylene glycol ethylmethyl ether, triethylene glycol dimethyl ether, triethylene glycol diethyl ether, triethylene glycol ethylmethyl ether, and tripropylene glycol ethylmethyl ether; an alkylene glycol monoalkyl ether ester such as propylene glycol monomethyl ether acetate, dipropylene glycol monomethyl ether acetate, propylene glycol monoethyl ether acetate, propylene glycol mono-n-propyl ether acetate, propylene glycol mono-1-propyl ether acetate, propylene glycol mono-n-butyl ether acetate, propylene glycol mono-1-butyl ether acetate, propylene glycol mono-sec-butyl ether acetate, and propylene glycol mono-t-butyl ether acetate; a ketone such as methylethylketone, cyclohexanone, 2-heptanone, 4-hydroxy-4-methyl-2-pentanone, cyclohexanone, and cyclopentanone; an alcohol such as methanol, ethanol, propanol, butanol, and 3-methoxy-3-methylbutanol; a cyclic ether such as tetrahydrofuran and dioxane; a cellosolve ester such as methyl cellosolve acetate and ethyl cellosolve acetate; an aromatic hydrocarbon such as benzene, toluene, and xylene; an ester such as ethyl acetate, butyl acetate, ethyl lactate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, and γ-butyrolactone; an amide such as N-methylformamide, N,N-dimethylfonamide, N-methyl-2-pyrrolidone, N-methylacetamide, and N,N-dimethylacetamide; a sulfoxide such as dimethyl sulfoxide; etc. may be mentioned.

Among these as well, diethylene glycol ethylmethyl ether, propylene glycol monomethyl ether acetate, cyclopentanone, and N-methyl-2-pyrrolidone are preferable. Note that the organic solvent (C) is usually removed after forming the resin film.

These organic solvents may be respectively used alone or as two types or more combined. In the resin composition of the present invention, the content of the organic solvent (C) is usually 20 to 10,000 parts by weight with respect to 100 parts by weight of the binder resin (A), preferably 50 to 5,000 parts by weight, more preferably 100 to 1,000 parts by weight.

(Compound (D))

The compound (D) used in the present invention is a compound having one atom selected from a silicon atom, titanium atom, aluminum atom, and zirconium atom and having a hydrocarbyloxy group or hydroxy group bonded with that atom.

Among these as well, as the compound (D), a compound having a hydrocarbyloxy group bonded with a silicon atom or titanium atom is preferable and a compound having a hydrocarbyloxy group bonded with a silicon atom is more preferable, while as the hydrocarbyloxy group, a hydrocarbyloxy group having 1 to 18 carbon atoms is preferable.

Further, the compound (D) is particularly preferably one having a functional group able to react with a protonic polar group when the binder resin (A) is one having a protonic polar group. As the functional group able to react with a protonic polar group, an isocyanate group, mercapto group, epoxy group, or amino group is preferable, while an epoxy group is more preferable.

As specific examples of the compound (D), tetraalkoxysilane such as tetramethoxysilane, tetraethoxysilane, tetra-n-propoxysilane, tetra-1-propoxysilane, and tetra-n-butoxysilane;

trialkoxysilane such as methyltrimethoxysilane, methyltriethoxysilane, ethyltrimethoxysilane, ethyltriethoxysilane, n-propyltriethoxysilane, n-propyltriethoxysilane, i-propyltriethoxysilane, i-propyltriethoxysilane, n-butyltrimethoxysilane, n-butyltriethoxysilane, n-pentyltrimethoxysilane, n-hexyltrimethoxysilane, n-heptyltrimethoxysilane, n-octyltrimethoxysilane, n-decyltrimethoxysilane, p-styryltrimthoxysilane, vinyltrimethoxysilane, vinyltriethoxysilane, cyclohexyltrimethoxysilane, cyclohexyltriethoxysilane, penyltriethoxysilane, phenyltriethoxysilane, 3-chloropropyltrimethoxysilane, 3-chloropropyltriethoxysilane, 3,3,3-trifluoropropyltrimethoxysilane, 3,3,3-trifluoropropyltriethoxysilane, 3-aminopropyltrimethoxysilane, 3-aminopropyltriethoxysilane, N-2-(aminoethyl)-3-aminopropyltrimethoxysilane, N-phenyl-3-aminopropyltriethoxysilane, 2-hydroxyethyltrimethoxysilane, 2-hydroxethyltriethoxysilane, 2-hydroxpropyltrimethoxysilane, 2-hydroxypropyltriethoxysilane, 3-hydroxypropyltrimethoxysilane, 3-hydroxypropyltriethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimthoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-(meth)acryloxypropyltrimethoxysilane, 3-(meth)acryloxypropyltriethoxysilane, 3-ureidopropyltrimethoxysilane, 3-ureidopropyltriethoxysilane, 3-ethyl(trimethoxysilylpropoxymethyl) oxetane, 3-ethyl(triethoxysilylpropoxymethyl) oxetane, 3-triethoxysilyl-N-(1,3-dimethyl-butylidene) propylamine, and bis(triethoxysilypropyl)tetrasulfide;

dialkoxysilane such as dimethyldimethoxysilane, dimethyldiethoxysilane, diethyldimethoxysilane, diethyldiethoxysilane, di-n-propyldimethoxysilane, di-n-propyldiethoxysilane, di-1-propyldimethoxysilane, di-1-propyldiethoxysilane, di-n-butyldimethoxysilane, di-n-pentyldimethoxysilane, di-n-pentyldiethoxysilane, di-n-hexyldimethoxysilane, di-n-hexyldiethoxysilane, di-n-heptyldimethoxysilane, di-n-heptyldiethoxysilane, di-n-octyldimethoxysilane, di-n-octyldiethoxysilane, di-n-cyclohexyldimethoxysilane, di-n-cyclohexyldiethoxysilane, diphenyldimethoxysilane, diphenyldiethoxysilane, 3-glycidoxypropylmethyldiethoxysilane, 3-methacryloxypropylmethyldimethoxysilane, 3-acryloxypropylmethyldimethoxysilane, 3-methacryloxypropylmethyldiethoxysilane, 3-acryloxypropylmethyldiethoxysilane, and N-2-(aminoethyl)-3-aminopropylmethyldimethoxysilane and also silicon atom-containing compound such as methyltriacetyloxysilane, dimethyldiacetyloxysilane, product name X-12-414, KBP-44 (made by Shin-Etsu Chemical) and 217FLAKE, 220FLAKE, 233FLAKE, and z6018 (made Toray-Dow Corning);

titanium atom-containing compound such as tetra-1-propoxytitanium, tetra-n-butoxytitanium, tetrakis(2-ethylhexyloxy) titanium, titanium-1-propoxyoctylene glycolate, di-1-propoxy-bis(acetylacetonate) titanium, propanedioxytitanium bis(ethylacetoacetate), tri-n-butoxytitanium monostearate, di-1-propoxytitanium distearate, titanium stearate, di-1-propoxytitanium diisostearate, (2-n-butoxycarbonylbenzoyloxy)tributoxytitanium, and di-n-butoxy-bis(triethanolaluminate) titanium, plus the Plenact series (made by Ajinomoto Fine-Techno);

aluminum atom-containing compound such as acetoalkoxyaluminum diisopropylate;

zirconium atom-containing compound such as tetra-n-propoxyzirconium, tetra-n-butoxyzirconium, zirconium tetraacetyl acetonate, zirconium tributoxyacetyl acetonate, zirconium monobutoxyacetyl acetonate bis(ethyl acetoacetate), zirconium dibutoxy bis(ethyl acetoacetate), zirconium tetraacetyl acetonate, and zirconium tributoxystearate; may be mentioned.

Among these as well, a silicon atom-containing compound and a titanium atom-containing compound are preferable, a silicon atom-containing compound is more preferable, and a silicon atom-containing compound having a functional group able to react with a protonic polar group is particularly preferable.

As the functional group able to react with a protonic polar group, an amino group, mercapto group, isocyanate group, glycidoxy group, epoxy group, and ureido group may be mentioned. A glycidoxy group or epoxy group is preferable.

As specific examples of the compound having a functional group able to react with a protonic polar group, 3-aminopropyltrimethoxysilane, 3-aminopropyltriethoxysilane, n-2-(aminoethyl)-3-aminopropyltrimethoxysilane, n-phenyl-3-aminopropyltrimethoxysilane, 3-mercaptopropyltrimethoxysilane, 3-mercaptopropyltriethoxysilane, 3-isocyanatepropyltrimethoxysilane, 3-isocyanatepropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl) ethyltriethoxysilane, 3-ureidopropyltrimethoxysilane, 3-ureidopropyltriethoxysilane, 3-triethoxysilyl-n-(1,3-dimethyl-butylidene) propylamine, and n-2-(aminoethyl)-3-aminopropylmethyldimethoxy silane are particularly preferable.

These compounds (D) may be respectively used alone or as two types or more combined.

In the resin composition of the present invention, the content of the compound (D) is 2.2 to 7.0 parts by weight with respect to 100 parts by weight of the binder resin (A), particularly 2.3 to 6.9 parts by weight, more preferably 2.4 to 6.8 parts by weight, still more preferably 2.5 to 4.5 parts by weight. If the content of the compound (D) is too small, the obtained resin film ends up becoming inferior in peel strength. On the other hand, if too great, the storage stability of the resin composition ends up falling.

(Radiation-Sensitive Compound (E))

Further, the resin composition of the present invention preferably further contains, in addition to the above components, a radiation-sensitive compound (E).

The radiation-sensitive compound (E) used in the present invention is a compound able to cause a chemical reaction by being irradiated with radiant energy such as ultraviolet rays and electron beans. In the present invention, the radiation-sensitive compound (E) is preferably one able to control the alkali solubility of a resin film formed by using a resin composition.

In the present invention, as the radiation-sensitive compound (E), a photoacid generator is preferably used.

As the radiation-sensitive compound (E), for example, an acetophenone compound, triarylsulfonium salt, and an azide compound such as a quinone diazide compound may be mentioned, but preferably it is an azide compound, particularly preferably a quinone diazide compound.

As a quinone diazide compound, for example, an ester compound of a quinone diazide sulfonic acid halide and a compound which has a phenolic hydroxyl group can be used. As specific examples of the quinone diazide sulfonic acid halide, 1,2-naphthoquinone diazide-5-sulfonic acid chloride, 1,2-naphthoquinone diazide-4-sulfonic acid chloride, 1,2-benzoquinone diazide-5-sulfonic acid chloride, etc. may be mentioned. As typical examples of a compound having a phenolic hydroxyl group, 1,1,3-tris(2,5-dimethyl-4-hydroxyphenyl)-3-phenyl propane, 4,4'-[1-[4-[1-[4-hydroxyphenyl]-1-methylethyl]phenyl]ethylidene]bisphenol, etc. may be mentioned. As other compounds which have phenolic hydroxyl groups, 2,3,4-trihydroxybenzophenone, 2,3,4,4'-tetrahydroxybenzophenone, 2-bis(4-hydroxyphenyl)propane, tris(4-hydroxyphenyl)methane, 1,1,1-tris(4-hydroxy-3-methylphenyl) ethane, 1,1,2,2-tetrakis(4-hydroxyphenyl) ethane, oligomers of novolac resins, oligomers obtained by copolymerization of a compound having one or more phenolic hydroxyl groups and dicyclopentadiene, etc. may be mentioned.

Among these as well, a condensate of 1,2-naphthoquinone diazide-5-sulfonic acid chloride and a compound having a phenolic hydroxyl group is preferable, while a condensate of 1,1,3-tris(2,5-dimethyl-4-hydroxyphenyl)-3-phenyl propane (1 mol) and 1,2-naphthoquinone diazide-5-sulfonic acid chloride (2.5 mol) is more preferable.

As the photoacid generator, in addition to a quinone diazide compound, a known one such as an onium salt, halogenated organic compound, α,α'-bis(sulfonyl) dizaomethane-based compound, α-carbonyl-α'-sulfonyldiazomethane-based compound, sulfone compound, organic acid ester compound, organic acid amide compound, organic acid imide compound, etc. may be used.

These radiation-sensitive compounds may be used alone or as two types or more combined.

In the resin composition of the present invention, the content of the radiation-sensitive compound (E) is preferably 1 to 100 parts by weight with respect to 100 parts by weight of the binder resin (A), more preferably 5 to 50 parts by weight, still more preferably 10 to 40 parts by weight. If the content of the radiation-sensitive compound (E) is in this range, when forming a resin film comprised of the resin composition of the present invention on arbitrary substrate and patterning the formed resin film, it is possible to enlarge the difference in solubility with respect to the developing solution between the parts irradiated by the radiant energy and the parts not irradiated by the radiant energy in the resin film and thereby facilitate patterning by development and raising the radiation sensitivity, so this is preferred.

(Cross-Linking Agent (F))

Further, the resin composition of the present invention preferably further contains, in addition to the above components, a cross-linking agent (F).

As the cross-linking agent (F), one having at least two functional groups able to react with the binder resin (A) in its molecule, preferably one having three or more these functional groups, is used. The functional group of the cross-linking agent (F) is not particularly limited so long as one able to react with the functional group or unsaturated bond etc. in the binder resin, but one able to react with a protonic polar group are preferable. As such a functional group, for example, amino group, hydroxyl group, epoxy group, isocyanate group, etc. may be mentioned, more preferably amino group, epoxy group, and isocyanate group, still more preferably amino group and epoxy group may be mentioned As specific examples of the cross-linking agent (F), an aliphatic polyamine such as hexamethylenediamine; an aromatic polyamine such as 4,4'-diaminodiphenyl ether and diaminodiphenyl sulfone; an azide such as 2,6-bis(4'-azidobenzal)cyclohexanone and 4,4'-diazidodiphenyl sulfone; a polyamide such as nylon, polyhexamethylenediamine terephthalamide, and polyhexamethylene isophthalamide; a compound having a melamine structure such as N,N,N',N', N",N"'-(hexaalkoxymethyl) melamine; a glycoluril such as N, N',N",N"'-(tetraalkoxymethyl)glycoluril; an acrylate compound such as ethylene glycoldi(meth)acrylate; an isocyanate-based compound such as a hexamethylene diisocyanate-based polyisocyanate, isophorone diisocyanate-based polyisocyanate, tolylene diisocyanate-based polyisocyanate, and hydrogenated diphenylmethane diisocyanate; 1,4-di-(hydroxymethyl)cyclohexane and 1,4-di-(hydroxymethyl) norbornane; 1,3,4-trihydroxycyclohexane; an epoxy compound such as a bisphenol A type epoxy resin, bisphenol F type epoxy resin, phenol novolac type epoxy resin, cresol novolac type epoxy resin, polyphenol type epoxy resin, cyclic aliphatic epoxy resin, aliphatic glycidyl ether, and epoxy acrylate polymer; may be mentioned.

As specific examples of the isocyanate-based compound, Sumitomo Bayer Urethane's Desmodur series (Desmodur BL3370 and Desmodur VPLS2253) and Crelan series (Crelan V1 and Crelan VPLS2256), Mitsui Takeda Chemicals' Takenate Series (B-815N, B-882N, and B-874N), Nippon Polyurethane Industry's Coronate series (Coronate L), etc. may be mentioned As specific examples of the compound having a melamine structure, "Cymel 300", "Cymel 301", "Cymel 303", "Cymel 350", "Cymel 1123", "Cymel 370", "Cymel 771", "Cymel 272 "," Mycoat 102", "Cymel 325", "Cymel 327", "Cymel 703", "Cymel 712", "Mycoat 105", "Mycoat 106", "Cymel 266", "Cymel 267", "Cymel 285", "Cymel 232", "Cymel 235", "Cymel 236", "Cymel 238", "Mycoat 506", "Cymel 701", "Cymel 272", "Cymel 212", "Cymel 253", "Cymel 254", "Mycoat 508", "Cymel 1128", "Mycoat 130", "Cymel 202", and "Cymel 207" (above made by Cytec Industries), Nikalac MW-30HM", "Nikalac MW390", "Nikalac MX-750", "Nikalac MK-750IM", and "Nikalac MK-706" (above made by Sanwa Chemical), etc. may be mentioned.

As specific examples of glycoluril, "Cymel 1170" and "Cymel 1172" (above made by Cytec Industries), "Nikalac MX-270" (above made by Sanwa Chemical), etc. may be mentioned.

As specific examples of epoxy compound, an epoxy compound having an alicyclic structure such as a trifunctional epoxy compound having dicyclopentadiene backbone (product name "XD-1000", made by Nippon Kayaku), a 1,2-epoxy-4-(2-oxiranyl)cyclohexane adduct of 2,2-bis(hydroxymethyl) 1-butanol (15-functional alicyclic epoxy resin having a cyclohexane backbone and end epoxy group, product name "EHPE3150", made by Daicel Corporation), epoxylated 3-cyclohexene-1,2-dicarboxylic acid bis(3-cyclohexenylmethyl)-modified ε-caprolactone (aliphatic cyclic trifunctional epoxy resin, product name "Epolead GT301", made by Daicel Corporation), epoxylated butanetetracarboxylic acid tetrakis(3-cyclohexenylmethyl)-modified ε-caprolactone (aliphatic cyclic tetrafunctional epoxy resin, product name "Epolead GT401", made by Daicel Corporation), 3,4-epoxycyclohexylmethyl acrylate (product name "Cyclomer A400", made by Daicel Corporation), 1,2,8,9-diepoxylimonene (product name "Celloxide 3000", made by Daicel Corporation), (3',4'-epoxycyclohexane)methyl-3,4-epoxycyclohexane carboxylate (product name "Celloxide 2021", made by Daicel Corporation), and 1,2-epoxy-4-vinylcyclohexane (product name "Celloxide 2000", made by Daicel Corporation); and an epoxy compound not having an alicyclic structure such as an aromatic amine type polyfunctional epoxy compound (product name "H-434", made by Tohto Chemical Industry), a cresol novolac type polyfunctional epoxy compound (product name "EOCN-1020", made by Nippon Kayaku), phenol novolac type polyfunctional epoxy compound (Epicoat 152, 154, made by Japan Epoxy Resin), a polyfunctional epoxy compound having a naphthalene backbone (product name EXA-4700, made by DIC Corporation), a chain alkyl polyfunctional epoxy compound (product name "SR-TMP", made by Sakamoto Yakuhin Kogyo), a polyfunctional epoxy polybutadiene (product name "Epolead PB3600", made by Daicel Corporation), a glycidyl polyether compound of glycerin (product name "SR-GLG", made by Sakamoto Yakuhin Kogyo), a diglycerin polyglycidyl ether compound (product name "SR-DGE", made by Sakamoto Yakuhin Kogyo), and a polyglycerin polyglycidyl ether compound (product name "SR-4GL", made by Sakamoto Yakuhin Kogyo); may be mentioned.

The cross-linking agents may be respectively used alone or as two types or more combined. Among these as well, a compound having a melamine structure and an epoxy compound are preferable. From the viewpoint of being able to further raise the peel strength of the obtained resin film, use of a compound having a melamine structure and an epoxy compound in combination is more preferable. In particular, the effect of raising the peel strength due to the combination of a compound having a melamine structure and an epoxy compound can be obtained without regard to the type of the binder resin (A). Further, among epoxy compounds, due to the high effect of improvement of the peel strength of the obtained resin film, an epoxy compound having an alicyclic structure is more preferable.

The molecular weight of the cross-linking agent (F) is not particularly limited, but is usually 100 to 100,000, preferably 500 to 50,000, more preferably 1,000 to 10,000.

In the resin composition of the present invention, the content of the cross-linking agent (F) is usually 0.1 to 200 parts by weight with respect to 100 parts by weight of the binder resin (A), preferably 1 to 150 parts by weight, more preferably 5 to 100 parts by weight. If the content of the cross-linking agent (F) is in this range, a sufficient heat resistance is obtained so this is preferable.

(Other Compounding Agents)

Further, the resin composition of the present invention may contain, as desired in a range where the effect of the present invention is not impaired, other compounding agents such as a surfactant, acidic compound, coupling agent or its derivative, sensitizer, latent acid generator, antioxidant, photostabilier, deformer, pigment, dye, or filler.

A surfactant is used for the purpose of prevention of striation, improvement of the development ability, etc. As specific examples of surfactant, nonionic surfactant such as polyoxyethylenealkyl ether such as polyoxyethylenelauryl ether, polyoxyethylenestearyl ether, and polyoxyethyleneoleyl ether; polyoxyethylenearyl ether such as polyoxyethyleneoctylphenyl ether and polyoxyethylenenonylphenyl ether; and polyoxyethylene dialkyl ester such as polyoxyethylene dilaurate and polyoxyethylene distearate; fluorine-based surfactant; silicone-based surfactant; methacrylic acid copolymer-based surfactant; acrylic acid copolymer-based surfactant; etc. may be mentioned.

A coupling agent or its derivative has the effect of improving more the peel strength of a resin film comprised of a resin composition with respect to a substrate.

As specific examples of the sensitizer, 2H-pyrido-(3,2-b)-1,4-oxazin-3(4H)-ones, 10H-pyrido (3,2-b)-1,4-benzothiadines, urazoles, hydantoins, barbituric acids, glycine anhydrides, 1-hydroxybenzotriazoles, alloxans, maleimides, etc. may be mentioned.

As the antioxidant, a phenol-based antioxidant, phosphorus-based antioxidant, sulfur-based antioxidant, lactone-based antioxidant, etc. used for a usual polymer can be used. For example, as phenols, 2,6-di-t-butyl-4-methylphenol, p-methoxyphenol, styrenated phenol, n-octadecyl-3-(3',5'-di-t-butyl-4'-hydroxyphenyl) propionate, 2,2'-methylene-bis (4-methyl-6-t-butylphenol), 2-t-butyl-6-(3'-t-butyl-5'-methyl-2'-hydroxybenzyl)-4-methylphenylacrylate, 4,4'-butylidene-bis-(3-methyl-6-t-butylphenol), 4,4'-thio-bis(3-methyl-6-t-butylphenol), pentaerythritol tetrakis[3-(3,5-di-t-butyl-4-hydroxyphenyl) propionate], alkylated bisphenol, etc. may be mentioned. As the phosphorus-based antioxidants, triphenyl phosphite and tris(nonylphenyl)phosphite may be mentioned, while as the sulfur-based ones, dilauryl thiodipropionate etc. may be mentioned.

As the photostabilier, benzophenone-based, salicylic acid ester-based, benzotriazole-based, cyanoacrylate-based, metal complex-based, and other ultraviolet ray absorbers, hindered amine-based light stabilizers (HALS) and other stabilizers which trap radicals generated due to light may be used. Among these as well, a HALS is a compound which has a piperidine structure and is preferable since it causes little coloring with respect to a radiation-sensitive resin composition and is good in stability. As specific compounds, bis(2,2,6,6-tetramethyl-4-piperidyl) sebacate, 1,2,2,6,6-pentamethyl-4-piperidyl/tridecyl-1,2,3,4-butanetetracarboxylate, bis(1-octyloxy-2,2,6,6-tetramethyl-4-piperidyl) sebacate, etc. may be mentioned.

The method of preparing the resin composition of the present invention is not particularly limited. The components for forming the resin composition may be mixed by a known method.

The method of mixing is not particularly limited, but the method for mixing solution or dispersion obtained by dissolving or dispersing components of the resin composition in an organic solvent (C) is preferable. By this method, the resin composition of the present invention is obtained in the form of a solution or dispersion.

The method of dissolving or dispersing components of the resin composition of the present invention in an organic solvent (C) may be an ordinary method. Specifically, the method of stirring using a stirrer and magnetic stirrer equipment, the method of using a high speed homogenizer, disperser, planetary stirrer, biaxial stirrer, ball mill, triple rolls, etc. may be mentioned. Further, after dissolving or dispersing each component in an organic solvent (C), for example, it may be filtered using a pore size 0.5 μm or so filter etc.

The solid content concentration when dissolving or dispersing each component of the resin composition of the present invention in an organic solvent (C) is usually 1 to 70 wt %, preferably 5 to 60 wt %, more preferably 10 to 50 wt %. If the solid content concentration is in this range, the dissolution stability, coatability on the substrate, uniformity of thickness, and flatness, etc. of the resin film formed can be obtained with a high balance.

(Resin Film)

The resin film of the present invention can be obtained using the above resin composition of the present invention. The radiation-sensitive resin film of the present invention is preferably obtained by the above resin composition of the present invention being formed on the substrate.

As the substrate, for example, a printed circuit board, silicon wafer substrate, soda glass or other glass substrate, polyethylene naphthalate or other plastic substrate, etc. may be used. Among these as well, a soda glass substrate used for a display device provided with a touch panel structure or a polyethylene naphthalate substrate is preferably used.

The method of forming the resin film is not particularly limited, but for example the coating method, film lamination method, or other method can be used.

The coating method is, for example, the method of coating a resin composition, then drying by heating to remove the solvent. As the method of coating the resin composition, for example, the spray method, spin coat method, roll coat method, die coat method, doctor blade method, spin coat method, bar coat method, screen print method, and other various methods can be employed. The heating and drying conditions differ according to the type and ratio of the ingredients, but are usually 30 to 150° C., preferably 60 to 120° C. usually for 0.5 to 90 minutes, preferably 1 to 60 minutes, more preferably 1 to 30 minutes.

The film lamination method is a method comprising coating a resin composition on a resin film, metal film or other substrate for forming B-stage film, then heating and drying it to remove the solvent to obtain the B-stage film, then laminating this B-stage film. The heating and drying conditions may be suitably selected in accordance with the types and ratios of content of the ingredients, but the heating temperature is usually 30 to 150° C. and the heating time is usually 0.5 to 90 minutes. The film lamination may be performed by using a press laminator, press, vacuum laminator, vacuum press, roll laminator, and other press bonding machines.

The thickness of the resin film is not particularly limited, but may be suitably set in accordance with the application, but when the resin film is a protective film or insulating film of, for example, a touch panel structure of a display device provided with a touch panel structure, the thickness of the resin film is preferably 0.1 to 100 μm, more preferably 0.5 to 50 μm, furthermore preferably 0.5 to 30 μm.

Further, in the present invention, it is possible to perform a cross-linking reaction for the resin after forming the resin film on the substrate.

The cross-linking of the resin film formed on the substrate may be performed by selecting a suitable method in accordance with the type of the cross-linking agent, but usually is performed by heating. The heating method, for example, may be one using a hot plate, oven, etc. The heating temperature is usually 180 to 250° C. The heating time is suitably selected in accordance with the size, thickness of the resin film, and the equipment which is used, etc. For example, when using a hot plate, it is normally 5 to 60 minutes, while when using an oven, it is normally 30 to 90 minutes. The heating may be performed in accordance with need in an inert gas atmosphere. The inert gas may be one which does not contain oxygen and which does not oxidize a resin film. For example, nitrogen, argon, helium, neon, xenon, krypton, etc. may be mentioned. Among these as well, nitrogen and argon are preferable. In particular, nitrogen is preferable. In particular, inert gas with an oxygen content of 0.1 vol % or less, preferably 0.01 vol % or less, in particular nitrogen, is suitable. These inert gases may be respectively used alone or as two types or more combined.

Further, if the resin composition of the present invention is one further containing the radiation-sensitive compound (E), the resin film formed on the substrate may be patterned to form a patterned resin film.

As the method of patterning a resin film, for example, the method of forming a resin film before patterning, irradiating active radiation at the resin film before patterning to form latent patterns, then bringing the resin film which has the latent patterns into contact with the developing solution to bring out the patterns etc. may be mentioned.

The active radiation is not particularly limited so long as able to activate radiation-sensitive compound (E) contained in the resin composition and change the alkali solubility of the resin composition containing the radiation-sensitive compound. Specifically, ultraviolet light, g-rays or i-rays and other single wavelength ultraviolet light, KrF excimer laser light, ArF excimer laser light, and other light beams; electron beams and other particle beams; etc. may be used. As the method of selectively radiating active radiation in a pattern manner to form latent patterns, an ordinary method may be used. For example, the method of using a reduced projection exposure apparatus etc. to irradiate ultraviolet light, g-rays, i-rays, KrF excimer laser light, ArF excimer laser light, and other light beams through a desired mask pattern or the method of using an electron beam or other particle beam for lithography etc. may be used. When using light beams as active radiation, single wavelength light or mixed wavelength light may be used. The irradiation conditions may be suitably selected in accordance with the active radiation used, but, for example, when using wavelength 200 to 450 nm light beams, the amount of irradiation is normally 10 to 1,000 mJ/cm$^2$, preferably 50 to 500 mJ/cm$^2$ in range and is determined in accordance with the irradiation time and illuminance. After irradiating the active radiation in this way, in accordance with need, the resin film is heat treated at 60 to 130° C. or so in temperature for 1 to 2 minutes or so.

Next, the latent patterns which are formed in the resin film before patterning are developed to bring them out. As the developing solution, normally aqueous solutions of alkali compounds may be used. As alkali compounds, for example, alkali metal salts, amines, and ammonium salts may be used. The alkaline compounds may be inorganic compounds or organic compounds. As specific examples of these compounds, sodium hydroxide, potassium hydroxide, sodium carbonate, sodium silicate, sodium metasilicate, and other alkali metal salts; ammonia water; ethylamine, n-propylamine, and other primary amines; diethylamine, di-n-propylamine, and other secondary amines; triethylamine, methyldiethylamine, and other tertiary amines; tetramethylammonium hydroxide, tetraethylammonium hydroxide, tetrabutylammonium hydroxide, choline, and other quaternary ammonium salts; dimethylethanolamine, triethanolamine, and other alcohol amines; pyrrole, piperidine, 1,8-diazabicyclo[5.4.0]undec-7-ene, 1,5-diazabicyclo[4.3.0]non-5-ene, N-methylpyrrolidone, and other cyclic amines; etc. may be mentioned. These alkali compounds may be respectively used alone or as two types or more combined.

As the aqueous medium which is used as the alkali aqueous solution, water; methanol, ethanol, and other water soluble organic solvents may be used. The alkali aqueous solution may have a surfactant etc. added in a suitable amount.

As the method for bringing the developing solution in contact with the resin film which has the latent patterns, for example, the puddle method, spray method, dipping method, and other methods may be used. The development conditions are suitably selected as normally 0 to 100° C., preferably 5 to 55° C., more preferably 10 to 30° C. and normally 30 to 180 seconds.

The resin film which is formed with the targeted patterns in this way, for example, may be washed by UV ozone treatment or may be rinsed by a rinse solution so as to remove development residue.

In the present invention, the resin film may be cross-linked after patterning. The cross-linking can be performed by the above-mentioned method.

(Electronic Device)

The electronic device of the present invention is provided with the above-mentioned resin film of the present invention. The electronic device of the present invention is not particularly limited, but various electronic devices may be mentioned. Specifically, a display device having a touch panel structure such as a touch palette and flexible organic EL display may be mentioned.

The display device having a touch panel structure used as one example of an electronic device of the present invention is not particularly limited, but one having a soda glass substrate or polyethylene naphthalate film on which electrode layers comprised of a pair of ITO electrodes etc. is placed sandwiching an insulating film may be mentioned. In this case, the resin film of the present invention explained above may be made an insulating film sandwiched between the electrode layers or a protective film for protecting the touch panel structure.

The resin composition of the present invention comprises a binder resin (A), a compound (B) having an acidic group or latent acidic group, an organic solvent (C), and a compound (D) having one atom selected from a silicon atom, titanium atom, aluminum atom, and zirconium atom and having a hydrocarbyloxy group or hydroxy group bonded to that atom, wherein the compound (B) is at least one type of compound selected from the group of an aliphatic compound, aromatic compound, and heterocyclic compound and the content of the compound (B) and content of the compound (D) are made the above specified ranges, so the resin film obtained using the resin composition of the present invention has a high peel strength with respect to the substrate and further is excellent in corrosion resistance with respect to a metal. In particular, the resin film obtained using the resin composition of the present invention exhibits high peel strength with respect to a substrate such as a soda glass substrate and polyethylene naphthalate film which are used in a display device having a touch panel structure. For this reason, the resin film obtained using such a resin composition of the present invention can be suitably used as an insulating film or protective film of a display device having a touch panel structure.

Note that the resin film obtained using the resin composition of the present invention can be suitably used for application of insulating film or protective film of display device having a touch panel structure, but of course can also be used for applications other than insulating film or protective film of display device having a touch panel structure.

EXAMPLES

Below, examples and comparative examples will be given to more specifically explain the present invention. In the examples, "parts" are based on weight unless otherwise indicated.

Note that the definitions and methods of evaluation of various characteristics are given below.

<Metal Corrosion Resistance>

On a glass substrate (made by Corning, product name Corning 1737), a sputtering apparatus was used to form a thickness 100 nm aluminum thin film. Next, a photoresist was used to pattern the aluminum thin film to thereby prepare a comb-type electrode substrate with Al interconnects of widths of 10 μm and distances between interconnects of 10 μm. The comb-type electrode substrate was coated with a resin composition by the spin coating method, then a hot plate was used to heat and dry (prebake) this at 90° C. for 2 minutes to form a thickness 2 μm resin film. Next, an exposure step was performed in the air. Next, a hot plate was used to heat this at 130° C. for 1 minute. Furthermore, this resin film was treated by immersing it in a 0.4 wt % tetramethylammonium hydroxide aqueous solution at 25° C. for 100 seconds, then was rinsed by ultrapure water for 30 seconds. Next, an oven was used to heat this in the atmosphere at 230° C. for 30 minutes as "postbaking" to thereby obtain samples formed with a resin film for a metal corrosion resistance test. Further, the obtained samples for a metal corrosion resistance test were placed in a constant temperature and constant humidity chamber of a temperature of 60° C. and a humidity of 90% in the state with 15V voltage applied. After 500 hours and 1000 hours, the samples were taken out and examined by an optical microscope. The following criteria were used to evaluate the metal corrosion resistance. The better the metal corrosion resistance, the better the reliability that can be judged.

Good: no corrosion observed at aluminum interconnects up to 1000 hours after placement in constant temperature and constant humidity chamber.

Fair: no corrosion observed at aluminum interconnects up to 500 hours after placement in constant temperature and constant humidity chamber, but corrosion observed at aluminum interconnects after 1000 hours.

Poor: corrosion observed at aluminum interconnects after 500 hours after placement in constant temperature and constant humidity chamber.

(Peel Strength)

A soda glass substrate was spin coated with a resin composition, and then this was prebaked using a hot plate at 110° C. for 2 minutes. Next, a 2.38 wt % tetramethylammonium hydroxide aqueous solution was used to treat this at 25° C. for 30 seconds to develop it, and then this was rinsed by ultrapure water for 30 seconds. Note that, the speed at the time of spin coating was controlled so that the resin film made to become a thickness of about 2.0 μm after postbaking. Next, this was irradiated by ultraviolet light with a light intensity at 365 nm of 50 mJ/an for 300 seconds in the air. Next, an oven was used to heat this in a nitrogen atmosphere at 230° C. for 30 minutes for postbaking to thereby obtain a resin film-covered substrate comprised of a resin film and soda glass substrate.

Further, the obtained resin film-covered substrate was stored in an environment of a temperature of 80° C. and a humidity of 85% for 24 hours, then was tested for peel strength by the surface and interfacial cutting analysis system method (SAICAS method). The specific evaluation conditions were as follows.

Specifically, the resin film part of the above obtained resin film-covered substrate was scored by a cutter by 1 mm widths. The scored resin film-covered substrate was measured by an adhesion measuring device of SAICAS Model EN-20 of Daipla Wintes using a single crystal diamond cutting blade (1.0 mm width, rake angle 20°, relief angle 10°) to cut the sample by a horizontal speed of 0.2 μm/sec and a vertical speed of 0.02 μm/sec and, when the cutting blade cut to the interface between the resin film and the soda glass surface, moving the blade in parallel to the substrate at a vertical speed of 0 μm/sec to measure the parallel force FH[N]. Further, from the obtained parallel force FH [N] and the width w[m] of the cutting blade, the peel strength P was found by the calculation formula "P[N/m]=FH[N]/w[m]". The obtained peel strength P was made the value of the peel strength between the resin film and soda glass substrate. Based on the obtained value of the peel strength, the peel strength of the obtained resin film-covered substrate was evaluated based on the following criteria.

Very good: peel strength P of 90 N/m or more
Good: peel strength P of 60 N/m to less than 90 N/m
Fair: peel strength P of 40 N/m to less than 60 N/m
Poor: peel strength P of less than 40 N/m <Storage Stability>

The resin composition was placed in a light-shielded bottle and allowed to stand in an environment of a temperature of 23° C. and a humidity of 50% for 3 months. Before standing and after standing, a Type E Visocmeter Model TVE-22L made by Toki Sang was used to measure the viscosity of the resin composition at a temperature of 25° C. The rate of rise of viscosity (units: %) was found. Further, based on the obtained value of the rate of rise of viscosity, the storage stability of the resin composition was evaluated by the following criteria.

Good: rate of rise of viscosity of less than 10%
Fair: rate of rise of viscosity of 10% to less than 20%
Poor: rate of rise of viscosity of 20% or more Synthesis Example 1

<Production of Cyclic Olefin Polymer (A1-1)>

100 parts of a monomer mixture comprised of 40 mol % of N-phenyl-bicyclo[2.2.1]hept-5-ene-2,3-dicarboxyimide (NBPI) and 60 mol % of 4-hydroxycarbonyltetracyclo [$6.2.1.1^{3,6}.0^{2,7}$]dodec-9-ene (TCDC), 2.0 parts of 1,5-hexadiene, 0.02 part of (1,3-dimesitylimidazolin-2-ylidene) (tricyclohexylphosphine)benzylideneruthenium dichloride (synthesized by method described in Org. Lett., vol. 1, p. 953, 1999), and 200 parts of diethylene glycolethylmethyl ether were charged into a glass pressure resistant reactor with an inside replaced with nitrogen. This was stirred while causing a reaction at 80° C. for 4 hours to obtain a polymerization reaction solution.

Further, the obtained polymerization reaction solution was placed in an autoclave, then it was stirred at 150° C. under a hydrogen pressure of 4 MPa for 5 hours to cause a hydrogenation reaction and obtain a polymer solution containing the cyclic olefin polymer (A1-1). The polymerization conversion rate of the obtained cyclic olefin polymer (A1-1) was 99.7%, the weight average molecular weight converted to polystyrene was 7,150, the number average molecular weight was 4,690, the molecular weight distribution was 1.52, and the hydrogenation rate was 99.7%. Further, the solid content concentration of the polymer solution of the obtained cyclic olefin polymer (A1-1) was 34.4 wt %.

Synthesis Example 2

<Production of Cardo Resin (A2-1)>

In a four-neck flask having a reflux cooler, 198.53 parts of a 50% propylene glycol monomethyl ether acetate solution of a reaction product of equivalent amounts of a bisphenol-fluorene type epoxy resin and acrylic acid (solid content concentration of 50%, acid value converted to solid content of 1.28 mgKOH/g, epoxy equivalent of 21,300, made by Nippon Steel Chemical, product name "ASF-400" solution), 39.54 parts of benzophenone tetracarboxylic acid dianhydride, 8.13 parts of succinic anhydride, 48.12 parts of propylene glycol monomethyl ether acetate, and 0.45 part of triphenylphosphine were charged. These were stirred for 1 hour while heating at 120 to 125° C. and further were heated and stirred at 75 to 80° C. for 6 hours, then 8.6 parts of glycidyl methacrylate was charged and the mixture further stirred at 80° C. for 8 hours. The obtained resin solution was concentrated by a rotary evaporator to obtain a solution of a cardo resin (A2-1) with a solid content concentration of 35 wt %.

Synthesis Example 3

<Production of Polysiloxane (A3-1)>

In a three-neck flask, 74.91 parts of methyltrimethoxysilane, 69.41 parts of phenyl trimethoxysilane, and 150.36 parts of diacetone alcohol (DAA) were charged. While stirring this at room temperature, a phosphoric acid aqueous solution of 55.8 parts of water in which 0.338 part of phosphoric acid (0.2 wt % with respected to charged monomers) was dissolved was added over 10 minutes. After that, the flask was immersed in a 70° C. oil bath and the inside stirred for 1 hour, then, the oil bath was raised in temperature to 115° C. over 30 minutes. The inside temperature of the solution reached 100° C. after 1 hour from the start of the temperature rise. The content was then heated and stirred for 2 hours (inside temperature of 100 to 110° C.). A total of 115 parts of the byproducts of methanol and water were distilled off. To the obtained DAA solution of the polysiloxane, DAA was added to give a solid content concentration of 35 wt % and obtain a solution of polysiloxane (A3-1).

Synthesis Example 4

<Production of Polyimide (A4-1)>

Under a flow of dry air, in a four-neck flask, 9.61 parts of 4,4'-diaminodiphenyl ether, 17.3 parts of bis[4-(4-aminophenoxy)phenyl]sulfone, 1.24 parts of bis(3-aminopropyl) tetramethyldisiloxane, and 102.5 parts of cyclopentanone were charged and made to dissolve at 40° C. After that, 6.54 parts of pyromellitic anhydride, 9.67 parts of 3,3',4,4'-benzophenone tetracarboxylic acid dianhydride, 12.41 parts of 3,3',4,4'-diphenyl ether tetracarboxylic acid dianhydride, and 30 parts of cyclopentanone were added and the mixture was made to react at 50° C. for 3 hours. This solution was concentrated by a rotary evaporator to obtain a solution of polyimide (A4-1) with a solid content concentration of 35 wt %.

Example 1

291 parts of a polymer solution of a binder resin (A) comprised of the cyclic olefin polymer (A1-1) obtained in Synthesis Example 1 (100 parts as cyclic olefin polymer (A1-1)), 25 parts of a radiation-sensitive compound (E) comprised of a condensate of 1,1,3-tris(2,5-dimethyl-4-hydroxyphenyl)-3-phenylpropane (1 mole) and 1,2-naphthoquinonediazide-5-sulfonic acid chloride (2.0 mole) (product name "TS-200", made by Toyogosei), 0.1 part of a compound (B) having an acidic group or latent acidic group comprised of 2-(carboxymethyl)benzoic acid (pKa=4 to 4.5), 100 parts of an organic solvent (C) comprised of diethylene glycolethylmethyl ether, 2.2 parts of a compound (D) comprised of 3-glycidoxypropyltrimethoxysilane, 20 parts of a cross-linking agent (F) comprised of epoxylated butanetetracarboxylic acid tetrakis(3-cyclohexenylmethyl)-modified ε-caprolactone (aliphatic cyclic tetrafunctional epoxy resin, product name "Epolead GT401", made by Daicel Chemical Industries), 2 parts of pentaerythritoltetrakis[3-(3,5-di-t-butyl-4-hydroxyphenyl)propionate] (product name "Irganox 1010", made by BASF), and 0.03 part of a silicone-based surfactant (product name "KP341", made by Shin-Etsu Chemical) were mixed, then the mixture was filtered by a pore size 0.45 an polytetrafluoroethylene filter to prepare a resin composition.

Further, the above obtained resin composition was used in accordance with the above methods to evaluate the metal corrosion resistance, peel strength, and storage stability. The results are shown in Table 1.

Examples 2 to 4

Except for changing the amounts of 2-(carboxymethyl) benzoic acid and/or 3-glycidoxypropyltrimethoxysilane as shown in Table 1, the same procedure was followed as in Example 1 to prepare resin compositions and the same procedure was followed to evaluate them. The results are shown in Table 1.

Example 5

Except for changing the amount of the 2-(carboxymethyl) benzoic acid from 0.1 part to 1.0 part and the amount of 3-glycidoxypropyltrimethoxysilane from 2.2 parts to 3.0 parts and further blending in 10 parts of a cross-linking agent (F) comprised of a compound having a melamine structure (product name "Nikalac MX-750IM", made by Sanwa Chemical), the same procedure was followed as in Example 1 to prepare a resin composition and the same procedure was followed to evaluate it. The results are shown in Table 1.

Example 6

Except for not blending in epoxylated butanetetracarboxylic acid tetrakis(3-cyclohexenylmethyl)-modified ε-caprolactone and changing the amount of the compound having a melamine structure (product name "Nikalac M-750IM") from 10 parts to 20 parts, the same procedure was followed as in Example 5 to prepare the resin composition and the same procedure was followed to evaluate it. The results are shown in Table 1.

Example 7

Except for using, instead of 0.1 part of 2-(carboxymethyl) benzoic acid, 1.0 part of 1,2-cyclohexanedicarboxylic acid (pKa=4.87) and changing the amount of 3-glycidoxypropyltrimethoxysilane from 2.2 parts to 3.0 parts, the same procedure was followed as in Example 1 to prepare a resin composition and the same procedure was followed to evaluate it. The results are shown in Table 1.

Example 8

Except for using, instead of 0.1 part of 2-(carboxymethyl) benzoic acid, 1.0 part of adipic acid (pKa=4.26) and changing the amount of 3-glycidoxypropyltrimethoxysilane from 2.2 parts to 3.0 parts, the same procedure was followed as in Example 1 to prepare a resin composition and the same procedure was followed to evaluate it. The results are shown in Table 1.

Example 9

Except for using, instead of 0.1 part of 2-(carboxymethyl) benzoic acid, 1.0 part of benzoic acid (pKa=4 to 4.2) and changing the amount of 3-glycidoxypropyltrimethoxysilane from 2.2 parts to 3.0 parts, the same procedure was followed as in Example 1 to prepare a resin composition and the sane procedure was followed to evaluate it. The results are shown in Table 1.

Example 10

Except for using, instead of 0.1 part of 2-(carboxymethyl) benzoic acid, 1.0 part of phthalic acid (pKa=2.95) and changing the amount of 3-glycidoxypropyltrimethoxysilane from 2.2 parts to 3.0 parts, the same procedure was followed as in Example 1 to prepare a resin composition and the same procedure was followed to evaluate it. The results are shown in Table 1.

Example 11

Except for using, instead of 0.1 part of 2-(carboxymethyl) benzoic acid, 1.0 part of pyrazine-2,3-dicarboxylic acid (pKa=2.95 or less) and changing the amount of 3-glycidoxypropyltrimethoxysilane from 2.2 parts to 3.0 parts, the same procedure was followed as in Example 1 to prepare a resin composition and the same procedure was followed to evaluate it. The results are shown in Table 1.

Example 12

Except for using, instead of 2.2 parts of 3-glycidoxypropyltrimethoxysilane, 3.0 parts of methyltrimethoxysilane and changing the amount of 2-(carboxymethyl)benzoic acid from 0.1 part to 1.0 part, the same procedure was followed as in Example 1 to prepare a resin composition and the same procedure was followed to evaluate it. The results are shown in Table 1.

Example 13

Except for using, instead of 2.2 parts of 3-glycidoxypropyltrimethoxysilane, 3.0 parts of 3-aminopropyltrimethoxysilane and changing the amount of 2-(carboxymethyl)benzoic acid from 0.1 part to 1.0 part, the same procedure was followed as in Example 1 to prepare a resin composition and the same procedure was followed to evaluate it. The results are shown in Table 2.

Example 14

Except for using, instead of 2.2 parts of 3-glycidoxypropyltrimethoxysilane, 3.0 parts of 3-mercaptopropyltrimethoxysilane and changing the amount of 2-(carboxymethyl)benzoic acid from 0.1 part to 1.0 part, the same procedure was followed as in Example 1 to prepare a resin composition and the same procedure was followed to evaluate it. The results are shown in Table 2.

Example 15

Except for using, instead of 2.2 parts of 3-glycidoxypropyltrimethoxysilane, 3.0 parts of 3-isocyanatepropyltriethoxysilane and changing the amount of 2-(carboxymethyl)benzoic acid from 0.1 part to 1.0 part, the same procedure was followed as in Example 1 to prepare a resin composition and the same procedure was followed to evaluate it. The results are shown in Table 2.

Example 16

Except for using, instead of 291 parts of a polymer solution of the cyclic olefin polymer (A1-1) obtained in Synthesis Example 1, 285.7 parts of the solution of the cardo resin (A2-1) obtained in Synthesis Example 2 (100 parts as cardo resin (A2-1)) and changing the amount of the 2-(carboxymethyl)benzoic acid from 0.1 part to 1.0 part and the amount of 3-glycidoxypropyltrimethoxysilane from 2.2 parts to 3.0 parts, the same procedure was followed as in Example 1 to prepare a resin composition and the same procedure was followed to evaluate it. The results are shown in Table 2.

Example 17

Except for using, instead of 291 parts of a polymer solution of the cyclic olefin polymer (A1-1) obtained in Synthesis Example 1, 285.7 parts of the solution of the polysiloxane (A3-1) obtained in Synthesis Example 3 (100 parts as polysiloxane (A3-1)) and changing the amount of 2-(carboxymethyl)benzoic acid from 0.1 part to 1.0 part and the amount of 3-glycidoxypropyltrimethoxysilane from 2.2 parts to 3.0 parts, the same procedure was followed as in Example 1 to prepare a resin composition and the same procedure was followed to evaluate it. The results are shown in Table 2.

Example 18

Except for using, instead of the 291 parts of a polymer solution of the cyclic olefin polymer (A1-1) obtained in Synthesis Example 1, 285.7 parts of the solution of the polysiloxane (A4-1) obtained in Synthesis Example 4 (100 parts as polysiloxane (A4-1)) and changing the amount of 2-(carboxymethyl)benzoic acid from 0.1 part to 1.0 part and the amount of 3-glycidoxypropyltrimethoxysilane from 2.2 parts to 3.0 parts, the same procedure was followed as in Example 1 to prepare a resin composition and the same procedure was followed to evaluate it. The results are shown in Table 2.

Example 19

Except for further blending in 10 parts of a cross-linking agent (F) comprised of a compound having a melamine structure (product name "Nikalac M-750LM", made by Sanwa Chemical), the sane procedure was followed as in Example 16 to prepare a resin composition and the same procedure was followed to evaluate it. The results are shown in Table 2.

Comparative Examples 1 to 4

Except for changing the amounts of 2-(carboxymethyl)benzoic acid and/or 3-glycidoxypropyltrimethoxysilane as shown in Table 1, the same procedure was followed as in Example 1 to prepare resin compositions and the same procedure was followed to evaluate them. The results are shown in Table 2.

TABLE 1

| | Example 1 | Example 2 | Example 3 | Example 4 | Example 5 | Example 6 |
|---|---|---|---|---|---|---|
| Resin composition | | | | | | |
| Binder resin (A) [parts] | — | — | — | — | — | — |
| Cyclic olefin polymer having protonic polar group | 100 | 100 | 100 | 100 | 100 | 100 |
| Cardo resin | — | — | — | — | — | — |
| Polysiloxane | — | — | — | — | — | — |
| Polyimide | — | — | — | — | — | — |
| Radiation-sensitive compound (E) [parts] | 25 | 25 | 25 | 25 | 25 | 25 |
| Compound (B) [parts] | | | | | | |
| 1,2-cyclohexane dicarboxylic acid | — | — | — | — | — | — |
| Adipic acid | — | — | — | — | — | — |
| Benzoic acid | — | — | — | — | — | — |

TABLE 1-continued

| | Example 1 | Example 2 | Example 3 | Example 4 | Example 5 | Example 6 |
|---|---|---|---|---|---|---|
| Phthalic acid | — | — | — | — | — | — |
| 2-(carboxymethyl)benzoic acid | 0.1 | 0.1 | 2.5 | 2.5 | 1.0 | 1.0 |
| Pyrazine-2,3-dicarboxylic acid | — | — | — | — | — | — |
| Compound (D) [parts] | | | | | | |
| Methyltrimethoxysilane | — | — | — | — | — | — |
| 3-aminopropyltrimethoxysilane | — | — | — | — | — | — |
| 3-glycidoxypropyltrimethoxysilane | 2.2 | 7.0 | 2.2 | 7.0 | 3.0 | 3.0 |
| 3-mercaptopropyltrimethoxysilane | — | — | — | — | — | — |
| 3-isocyanatepropyltriethoxysilane | — | — | — | — | — | — |
| Cross-linking agent (F) [parts] | | | | | | |
| Nikalac MX-750LM | — | — | — | — | 10 | 20 |
| Epolead GT401 | 20 | 20 | 20 | 20 | 20 | — |
| Metal corrosion resistance test (hours) | Good >1000 | Good >1000 | Good >1000 | Good >1000 | Good >1000 | Good >1000 |
| Peel strength (N/m) | Good 76 | Good 72 | Good 81 | Good 87 | Very good 95 | Good 83 |
| Storage stability (%) | Good 2 | Good 3 | Good 6 | Good 8 | Good 1 | Good 3 |

| | Example 7 | Example 8 | Example 9 | Example 10 | Example 11 | Example 12 |
|---|---|---|---|---|---|---|
| Resin composition | | | | | | |
| Binder resin (A) [parts] | — | — | — | — | — | — |
| Cyclic olefin polymer having protonic polar group | 100 | 100 | 100 | 100 | 100 | 100 |
| Cardo resin | — | — | — | — | — | — |
| Polysiloxane | — | — | — | — | — | — |
| Polyimide | — | — | — | — | — | — |
| Radiation-sensitive compound (E) [parts] | 25 | 25 | 25 | 25 | 25 | 25 |
| Compound (B) [parts] | | | | | | |
| 1,2-cyclohexane dicarboxylic acid | 1.0 | — | — | — | — | — |
| Adipic acid | — | 1.0 | — | — | — | — |
| Benzoic acid | — | — | 1.0 | — | — | — |
| Phthalic acid | — | — | — | 1.0 | — | — |
| 2-(carboxymethyl)benzoic acid | — | — | — | — | — | 1.0 |
| Pyrazine-2,3-dicarboxylic acid | — | — | — | — | 1.0 | — |
| Compound (D) [parts] | | | | | | |
| Methyltrimethoxysilane | — | — | — | — | — | 3.0 |
| 3-aminopropyltrimethoxysilane | — | — | — | — | — | — |
| 3-glycidoxypropyltrimethoxysilane | 3.0 | 3.0 | 3.0 | 3.0 | 3.0 | — |
| 3-mercaptopropyltrimethoxysilane | — | — | — | — | — | — |
| 3-isocyanatepropyltriethoxysilane | — | — | — | — | — | — |
| Cross-linking agent (F) [parts] | | | | | | |
| Nikalac MX-750LM | — | — | — | — | — | — |
| Epolead GT401 | 20 | 20 | 20 | 20 | 20 | 20 |
| Metal corrosion resistance test (hours) | Good >1000 | Good >1000 | Good >1000 | Good >1000 | Good >1000 | Good >1000 |
| Peel strength (N/m) | Good 88 | Good 89 | Fair 53 | Fair 57 | Fair 58 | Fair 45 |
| Storage stability (%) | Good 3 | Good 2 | Fair 12 | Good 3 | Fair 10 | Good 8 |

TABLE 2

| | Example 13 | Example 14 | Example 15 | Example 16 | Example 17 | Example 18 |
|---|---|---|---|---|---|---|
| Resin composition | | | | | | |
| Binder resin (A) [parts] | — | — | — | — | — | — |
| Cyclic olefin polymer having protonic polar group | 100 | 100 | 100 | — | — | — |
| Cardo resin | — | — | — | 100 | — | — |
| Polysiloxane | — | — | — | — | 100 | — |
| Polyimide | — | — | — | — | — | 100 |
| Radiation-sensitive compound (E) [parts] | 25 | 25 | 25 | 25 | 25 | 25 |
| Compound (B) [parts] | | | | | | |
| 1,2-cyclohexane dicarboxylic acid | — | — | — | — | — | — |
| Adipic acid | — | — | — | — | — | — |
| Benzoic acid | — | — | — | — | — | — |

TABLE 2-continued

| | | | | | | |
|---|---|---|---|---|---|---|
| Phthalic acid | — | — | — | — | — | — |
| 2-(carboxymethyl)benzoic acid | 1.0 | 1.0 | 1.0 | 1.0 | 1.0 | 1.0 |
| Pyrazine-2,3-dicarboxylic acid | — | — | — | — | — | — |
| Compound (D) [parts] | | | | | | |
| Methyltrimethoxysilane | — | — | — | — | — | — |
| 3-aminopropyltrimethoxysilane | 3.0 | — | — | — | — | — |
| 3-glycidoxypropyltrimethoxysilane | — | — | — | 3.0 | 3.0 | 3.0 |
| 3-mercaptopropyltrimethoxysilane | — | 3.0 | — | — | — | — |
| 3-isocyanatepropyltriethoxysilane | — | — | 3.0 | — | — | — |
| Cross-linking agent (F) [parts] | | | | | | |
| Nikalac MX-750LM | — | — | — | — | — | — |
| Epolead GT401 | 20 | 20 | 20 | 20 | 20 | 20 |
| Metal corrosion resistance test (hours) | Good >1000 | Good >1000 | Good >1000 | Fair >500 | Fair >500 | Fair >500 |
| Peel strength (N/m) | Good 80 | Good 66 | Good 69 | Fair 52 | Fair 58 | Fair 55 |
| Storage stability (%) | Good 8 | Fair 13 | Fair 11 | Good 9 | Fair 15 | Good 8 |

| | Example 19 | Comp. Example 1 | Comp. Example 2 | Comp. Example 3 | Comp. Example 4 |
|---|---|---|---|---|---|
| Resin composition | | | | | |
| Binder resin (A) [parts] | | | | | |
| Cyclic olefin polymer having protonic polar group | — | 100 | 100 | 100 | 100 |
| Cardo resin | 100 | — | — | — | — |
| Polysiloxane | — | — | — | — | — |
| Polyimide | — | — | — | — | — |
| Radiation-sensitive compound (E) [parts] | 25 | 25 | 25 | 25 | 25 |
| Compound (B) [parts] | | | | | |
| 1,2-cyclohexane dicarboxylic acid | — | — | — | — | — |
| Adipic acid | — | — | — | — | — |
| Benzoic acid | — | — | — | — | — |
| Phthalic acid | — | — | — | — | — |
| 2-(carboxymethyl)benzoic acid | 1.0 | 0.05 | 3.0 | 1.0 | 1.0 |
| Pyrazine-2,3-dicarboxylic acid | — | — | — | — | — |
| Compound (D) [parts] | | | | | |
| Methyltrimethoxysilane | — | — | — | — | — |
| 3-aminopropyltrimethoxysilane | — | — | — | — | — |
| 3-glycidoxypropyltrimethoxysilane | 3.0 | 3.0 | 3.0 | 2.0 | 8.0 |
| 3-mercaptopropyltrimethoxysilane | — | — | — | — | — |
| 3-isocyanatepropyltriethoxysilane | — | — | — | — | — |
| Cross-linking agent (F) [parts] | | | | | |
| Nikalac MX-750LM | 10 | — | — | — | — |
| Epolead GT401 | 20 | 20 | 20 | 20 | 20 |
| Metal corrosion resistance test (hours) | Fair >500 | Good >1000 | Poor <500 | Good >1000 | Good >1000 |
| Peel strength (N/m) | Good 62 | Poor 7 | Good 77 | Poor 15 | Good 83 |
| Storage stability (%) | Good 9 | Good 2 | Good 7 | Good 2 | Poor 23 |

As shown in Tables 1 and 2, a resin composition containing a binder resin (A), a compound (B) having an acidic group, an organic solvent (C), and a compound (D) having one atom selected from a silicon atom, titanium atom, aluminum atom, and zirconium atom and having a hydrocarbyloxy group or hydroxy group bonded with that atom, wherein the compound (B) having the acidic group is at least one type selected from the group consisting of an aliphatic compound, aromatic compound, and heterocyclic compound, and a content of the compound (B) is 0.1 to 2.5 parts by weight and a content of the compound (D) is 2.2 to 7.0 parts by weight with respect to 100 parts by weight of the binder resin (A), is excellent in storage stability. Furthermore, a resin film obtained using that resin composition is high in peel strength with respect to a substrate and is excellent in corrosion resistance with respect to a metal (Examples 1 to 19).

On the other hand, if the content of the compound (B) is too small or if the content of the compound (D) is too small, the obtained resin film is inferior in peel strength with respect to a substrate (Comparative Examples 1 and 3).

Further, if the content of the compound (B) is too large, the obtained resin film is inferior in corrosion resistance with respect to a metal (Comparative Example 2).

Furthermore, if the content of the compound (D) is too small, the storage stability as a resin composition is inferior (Comparative Example 4).

The invention claimed is:

1. A resin composition comprising a binder resin (A), a compound (B) having an acidic group, an organic solvent (C), and a compound (D) having one atom selected from a silicon atom, titanium atom, aluminum atom, and zirconium atom and having a hydrocarbyloxy group or hydroxy group bonded with that atom, wherein the binder resin (A) is at least one type of polymer selected from a cyclic olefin polymer having a protonic polar group, cardo resin, polysiloxane, and polyimide, wherein the compound (B) has, as the acidic group, a carboxy group, thiol group, or carboxymethylenethio group, and wherein a content of the compound (B) is 0.1 to 2.5 parts by weight and a content of the compound (D) is 2.2 to 7.0 parts by weight with respect to 100 parts by weight of the binder resin (A).

2. The resin composition according to claim 1, further comprising a radiation-sensitive compound (E).

3. The resin composition according to claim 1, further comprising a cross-linking agent (F).

4. The resin composition according to claim 3 comprising, as the cross-linking agent (F), an epoxy compound and a compound having a melamine structure.

5. The resin composition according to claim 1, wherein the compound (D) is a compound further having a functional group able to react with a protonic polar group.

6. The resin composition according to claim 5, wherein the functional group able to react with a protonic polar group is an isocyanate group, mercapto group, epoxy group, or amino group.

7. The resin composition according to claim 1, wherein the compound (D) is a compound having a hydrocarbyloxy group bonded with a silicon atom.

8. The resin composition according to claim 1, wherein the compound (B) is a compound having two or more acidic groups.

9. A resin film obtained using the resin composition according to claim 1.

10. An electronic device provided with the resin film according to claim 9.

* * * * *